US012699128B2

(12) United States Patent
Werner et al.

(10) Patent No.: US 12,699,128 B2
(45) Date of Patent: Aug. 4, 2026

(54) METHODS AND DEVICES FOR TESTING A DEVICE UNDER TEST USING TEST SITE SPECIFIC THERMAL CONTROL SIGNALING

(71) Applicant: Advantest Corporation, Tokyo (JP)

(72) Inventors: Matthias Werner, Bibertal (DE); Martin Fischer, Heilbronn (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 18/104,165

(22) Filed: Jan. 31, 2023

(65) Prior Publication Data

US 2023/0228805 A1 Jul. 20, 2023

Related U.S. Application Data

(63) Continuation of application No. PCT/EP2021/071818, filed on Aug. 4, 2021.

(51) Int. Cl.
*G01R 31/28* (2006.01)
*G01R 31/317* (2006.01)
*G01R 31/319* (2006.01)

(52) U.S. Cl.
CPC ..... *G01R 31/2834* (2013.01); *G01R 31/2867* (2013.01); *G01R 31/2874* (2013.01); *G01R 31/2893* (2013.01); *G01R 31/31725* (2013.01); *G01R 31/31905* (2013.01)

(58) Field of Classification Search
CPC ............ G01R 31/2834; G01R 31/2867; G01R 31/2874; G01R 31/2893; G01R 31/31725; G01R 31/31905
See application file for complete search history.

(56) References Cited

U.S. PATENT DOCUMENTS

| | | | |
|---|---|---|---|
| 6,323,669 B1 | 11/2001 | Kang | |
| 2002/0088113 A1* | 7/2002 | Hwang | G01R 31/01 |
| | | | 29/844 |
| 2008/0079456 A1 | 4/2008 | Lee | |
| 2012/0169363 A1 | 7/2012 | Mayfield | |
| 2013/0181733 A1* | 7/2013 | Kikuchi | G01R 31/2874 |
| | | | 324/750.16 |
| 2015/0120234 A1 | 4/2015 | Tao | |

(Continued)

FOREIGN PATENT DOCUMENTS

| | | |
|---|---|---|
| CN | 105004985 A | 10/2015 |
| CN | 205982320 U | 2/2017 |

(Continued)

*Primary Examiner* — Judy Nguyen
*Assistant Examiner* — Adam S Clarke

(57) ABSTRACT

Embodiments of the present invention provide an automated test equipment (a "tester") for testing a device under test, including a bidirectional dedicated real-time handler interface. Some embodiments include an interface having a trigger function, a fixed endpoint interface, an interface arranged on a test head, and/or a number of lines/communication channels adapted to a specific communication task, without separate signal lines, for example. The bidirectional dedicated real-time handler interface can be used to transmit thermal control signals, and the transmitted signals can be test site specific. The real-time signaling advantageously improves testing accuracy and efficiency.

18 Claims, 13 Drawing Sheets

1500

Receiving, via a real-time tester interface, a trigger signal, and, in addition to the trigger signaling, an additional signal that includes control information for determining or modifying a temperature control profile or temperature regulation performed by the handler, information about one or more measured values determined by the automated test equipment or extracted from a device under test data stream by the automated test equipment, alarm information, and/or one or more test state parameters ∼1510

Using the additional signal to control the temperature of one or more devices under test/ test sites ∼1520

(56) References Cited

U.S. PATENT DOCUMENTS

| | | | | |
|---|---|---|---|---|
| 2015/0137844 A1* | 5/2015 | Kikuchi | ............... | G01R 1/0466 |
| | | | | 324/756.02 |
| 2016/0041202 A1* | 2/2016 | Peng | .................. | G01R 31/2635 |
| | | | | 324/750.11 |
| 2016/0131709 A1* | 5/2016 | Yoo | .................. | G01R 31/31924 |
| | | | | 324/762.01 |
| 2019/0086468 A1* | 3/2019 | Yoshino | ............. | G01R 31/2834 |
| 2019/0378590 A1 | 12/2019 | Joo et al. | | |
| 2020/0160932 A1 | 5/2020 | Motika et al. | | |
| 2020/0241040 A1 | 7/2020 | Yoshino et al. | | |
| 2022/0128625 A1* | 4/2022 | Akers | ................ | G01R 31/2875 |

FOREIGN PATENT DOCUMENTS

| | | |
|---|---|---|
| CN | 106546902 A | 3/2017 |
| CN | 111289881 A | 6/2020 |
| EP | 3217183 | 9/2017 |
| JP | 60-013267 A | 1/1985 |
| JP | 62-272166 A | 11/1987 |
| JP | H06-030784 U | 4/1994 |
| JP | 2000-241496 A | 9/2000 |
| JP | 2001-116799 A | 4/2001 |
| JP | 2002-350490 A | 12/2002 |
| JP | 2004-527764 A | 9/2004 |
| JP | 2006-119137 A | 5/2006 |
| JP | 2008-116220 A | 5/2008 |
| JP | 2011-527746 A | 11/2011 |
| JP | 2013-145132 A | 7/2013 |
| JP | 2015-031414 A | 2/2015 |
| JP | 2020-016560 A | 1/2020 |
| KR | 10-0499909 B1 | 9/2005 |
| KR | 1999-0084752 A | 9/2005 |
| KR | 2008-0030046 A | 4/2008 |
| KR | 10-2131954 B | 7/2020 |
| TW | 201504647 A | 2/2015 |
| TW | 201830028 A | 8/2018 |
| WO | 2007010610 A1 | 1/2007 |
| WO | 2007023557 A1 | 3/2007 |

* cited by examiner

600

900

| Receiving a trigger signal from an automated test equipment via a real-time tester interface | 910 |

| Triggering a temperature control function in response to the received trigger signal | 920 |

| Receiving a synchronization signal from the automated test equipment via the tester interface | 930 |

| Synchronizing a function with the automated test equipment (other than triggering the temperature control function) in response to the received synchronization signal | 940 |

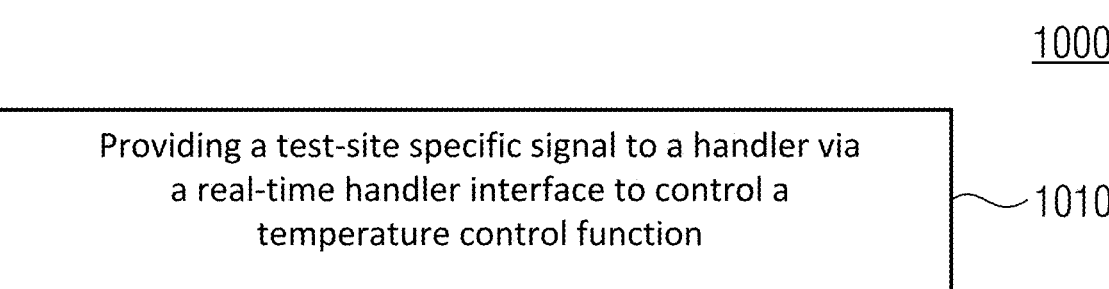

| Providing a test-site specific signal to a handler via a real-time handler interface to control a temperature control function | 1010 |

Fig. 10

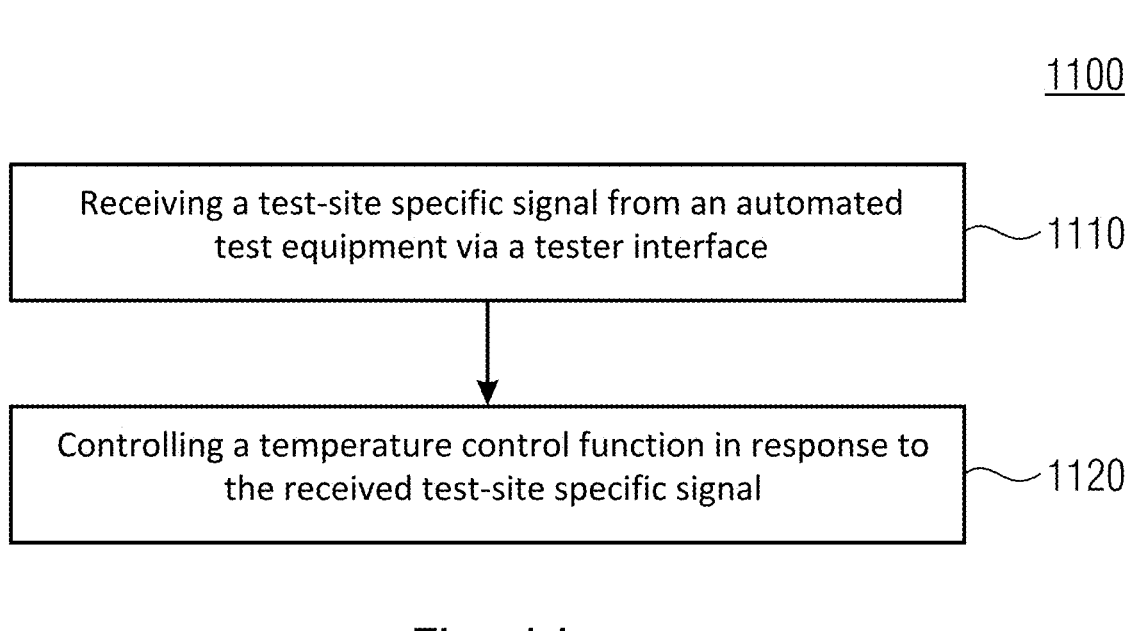

1100

Receiving a test-site specific signal from an automated test equipment via a tester interface ──1110

Controlling a temperature control function in response to the received test-site specific signal ──1120

Fig. 11

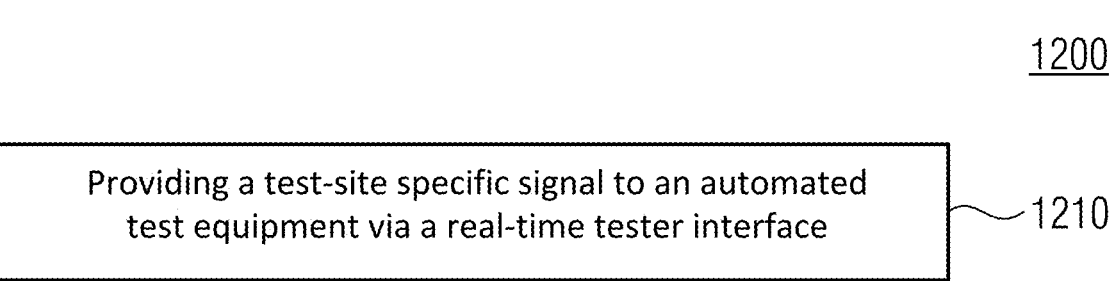

1200

Providing a test-site specific signal to an automated test equipment via a real-time tester interface ──1210

Fig. 12

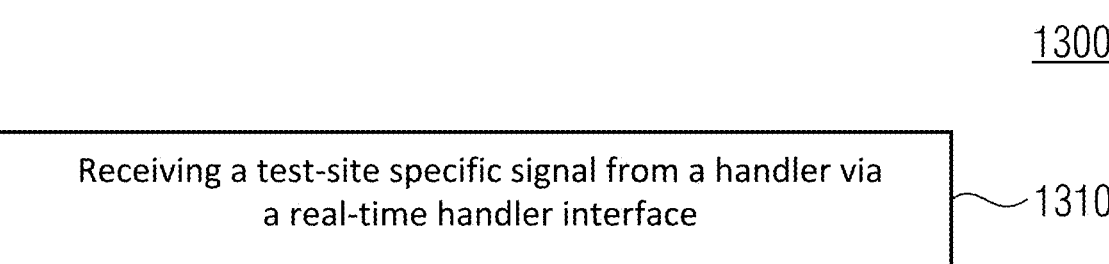

1300

Receiving a test-site specific signal from a handler via a real-time handler interface ──1310

Figures 14, 15:
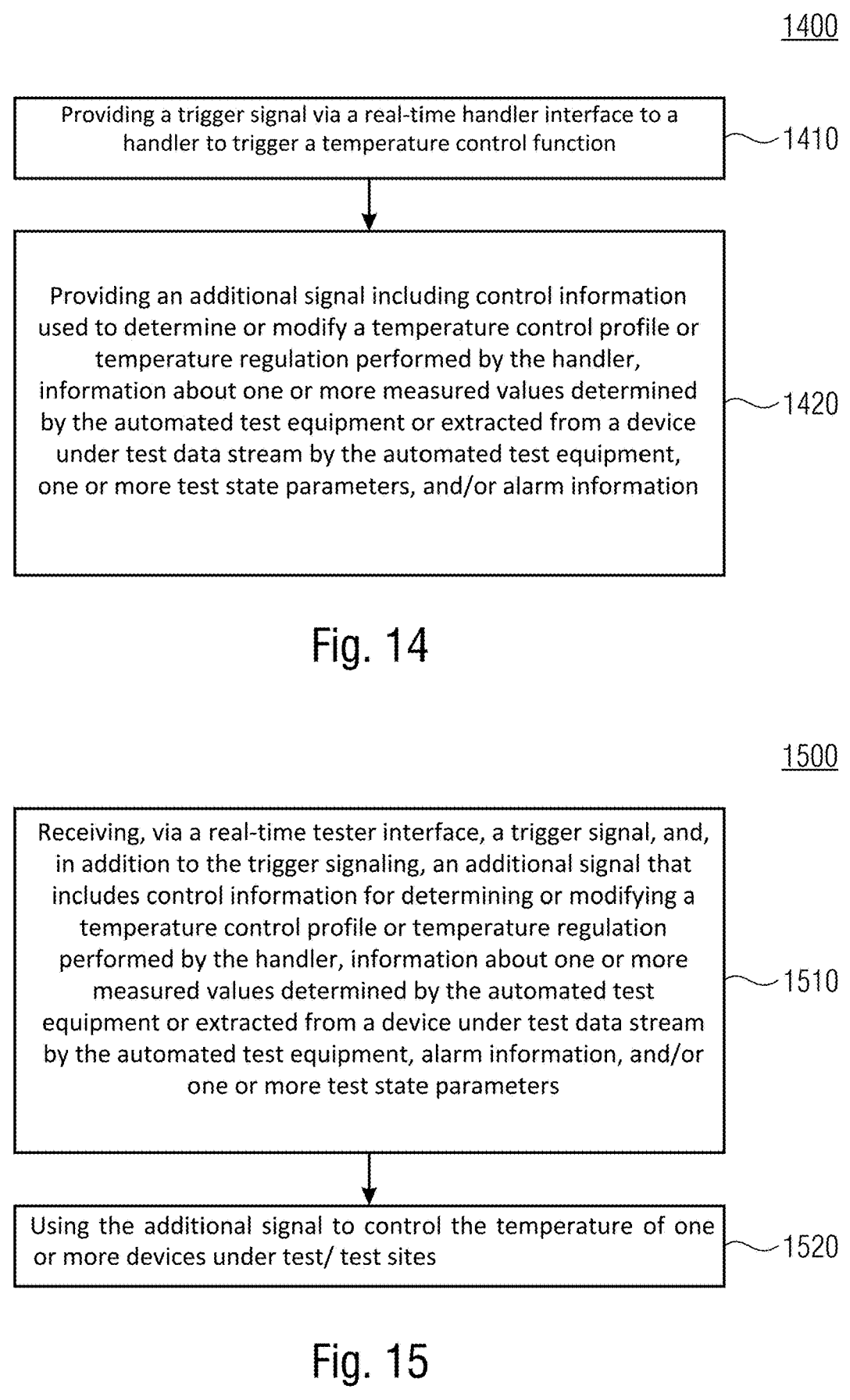

Providing a trigger signal via a real-time handler interface to a handler to trigger a temperature control function — 1410

Providing an additional signal including control information used to determine or modify a temperature control profile or temperature regulation performed by the handler, information about one or more measured values determined by the automated test equipment or extracted from a device under test data stream by the automated test equipment, one or more test state parameters, and/or alarm information — 1420

Receiving, via a real-time tester interface, a trigger signal, and, in addition to the trigger signaling, an additional signal that includes control information for determining or modifying a temperature control profile or temperature regulation performed by the handler, information about one or more measured values determined by the automated test equipment or extracted from a device under test data stream by the automated test equipment, alarm information, and/or one or more test state parameters — 1510

Using the additional signal to control the temperature of one or more devices under test/ test sites — 1520

Fig. 15 optional: test flow example,
e.g. testflow with testsuites test-site, e.g. site 1 gets trigger, e.g. pre-trigger: 1, 3
test-site, e.g. site 2 gets trigger, e.g. pre-trigger: 1, 2, 3

METHODS AND DEVICES FOR TESTING A DEVICE UNDER TEST USING TEST SITE SPECIFIC THERMAL CONTROL SIGNALING

CROSS-REFERENCE TO RELATED APPLICATIONS

This Application claims priority to and is a continuation of International Application No. PCT/EP2021/071818 filed Aug. 4, 2021, which is incorporated herein by reference in its entirety as if it were put forth in full below. This Application is related to and incorporates by reference the following co-pending US Patent Applications: U.S. patent application Ser. No. 18/104,149, filed Jan. 31, 2023; U.S. patent application Ser. No. 18/104,159, filed Jan. 31, 2023; U.S. patent application Ser. No. 18/104,193, filed Jan. 31, 2023; and U.S. patent application Ser. No. 18/104,183, filed Jan. 31, 2023.

FIELD

Embodiments of the present invention generally relate to the field of electronic device testing. More specifically, embodiments of the present invention relate to methods and systems for device testing using real-time interfaces.

BACKGROUND

A device or equipment under test (e.g., a DUT) is typically tested to determine the performance and consistency of the device before the device is sold. The device can be tested using a large variety of test cases, and the result of the test cases is compared to an expected output result. When the result of a test case does not match the expected output value, the device can be considered a failed device or outlier, and the device can be binned based on performance, etc.

A DUT is usually tested by automatic or automated test equipment (ATE), which may be used to conduct complex testing using software and automation to improve the efficiency of testing according to a test program, for example. The DUT may be any type of electronic device including a semiconductor device, wafer, or component that is intended to be integrated into a final product, such as a computer or other electronic device. By removing defective or unsatisfactory chips at manufacture using ATE, the quality of the yield can be significantly improved.

Complex digital devices such as, microprocessors, graphics processing units, and microcontrollers may consume a relatively large amount power. Power consumption and device temperature profile may vary throughout testing and may be test site dependent. Precise temperature control may be important or even essential to test these devices in some cases where a "flat" and/or predictable temperature profile is desired.

In addition, it is often important to provide testing equipment that is capable of performing tests with a high degree of precision without adding a great degree of effort or complexity to the testing process.

SUMMARY

What is needed is an approach to DUT testing that achieves a compromise between temperature control efficiency, testing precision and complexity of the testing equipment. Accordingly, embodiments of the present invention provide an automated test equipment (a "tester") for testing a device under test, including a bidirectional dedicated real-time handler interface. Some embodiments include an interface having a trigger function, a fixed endpoint interface, an interface arranged on a test head, or a number of lines/communication channels adapted to a specific communication task, without separate signal lines, for example. The bidirectional dedicated real-time handler interface can be used to transmit a synchronization signal or other information to the handler in real-time, and the transmitted signal can be test site specific. The real-time signaling advantageously improves testing accuracy and efficiency.

According to one embodiment, an automated test equipment (ATE) system for testing a device under test (DUT) is disclosed. The ATE system includes a handler and a real-time handler interface The real-time handler interface is operable to provide a test site specific signal to the handler coupled to the real-time handler interface and control a temperature control function of the handler according to the signal.

According to some embodiments, the test site specific signal includes at least one of: a test site specific alarm; a test site specific trigger identification; a test site specific temperature adjustment; test site specific setup information; test site specific heat dissipation information; and test site specific timing information.

According to some embodiments, the test site specific signal includes test site identification information and regulation information, and where the test site identification information associates the regulation information with a specific test site.

According to some embodiments, the test site identification information includes a test site ID modulated onto the test site specific signal.

According to some embodiments, the regulation information includes at least one of: timing information; control amplitude information; and control duration information.

According to some embodiments, where the real-time handler interface is further operable to provide a single trigger signal for a plurality of test sites and provide delay information for different test sites that describes delays between a trigger event and a beginning of thermal preconditioning operations performed for the different test sites.

According to some embodiments, the real-time handler interface is further operable to provide the site specific signal in response to a DUT reaching a predetermined state of a test flow.

According to another embodiment, a handler for testing a device under test (DUT) is disclosed. The handler includes a circuit and a real-time tester interface. The circuit is operable to receive a test site specific signal from an automated test equipment (ATE) coupled to the rea-time tester interface and control a temperature control function in response to the test site specific signal.

According to some embodiments, the circuit is further operable to receive the test site specific signal from the ATE via the real-time tester interface, and where the test site specific signal includes at least one of: a test site specific alarm; test site specific trigger identification information; test site specific temperature adjustment information; test site specific setup information; test site specific heat dissipation information; and test site specific timing information.

According to some embodiments, the test site specific signal includes: test site identification information; and regulation information, and where the test site identification information associates the regulation information with a specific test site.

According to some embodiments, the test site identification information includes a test site ID modulated onto the test site specific signal.

According to some embodiments, the regulation information includes at least one of: timing information; control amplitude information; and control duration information.

According to some embodiments, the circuit is further operable to receive a single trigger signal for a plurality of test sites and receive delay information for different test sites that describes delays between a trigger event and a beginning of thermal preconditioning operations performed for the different test sites.

According to another embodiment, a method of testing a device under test (DUT) is disclosed. The method includes providing a test site specific signal to a handler coupled to a DUT via a real-time handler interface and controlling a temperature control function according to the test site specific signal to test the DUT.

According to some embodiments, the test site specific signal includes at least one of: a test site specific alarm; test site specific trigger identification information; test site specific temperature adjustment information; test site specific setup information; test site specific heat dissipation information; and test site specific timing information.

According to some embodiments, the test site specific signal includes: test site identification information; and regulation information, and where the test site identification information associates the regulation information with a specific test site.

According to some embodiments, the test site identification information includes a test site ID modulated onto the test site specific signal.

According to a different embodiment, a method of testing a device under test (DUT) is disclosed. The method includes receiving, at a handler, a test site specific signal from an automated test equipment (ATE) via a real-time tester interface and controlling a temperature control function of the handler in response to the test site specific signal to test a DUT coupled to the handler.

According to some embodiments, the test site specific signal includes at least one of: a test site specific alarm; test site specific trigger identification information; test site specific temperature adjustment information; test site specific setup information; test site specific heat dissipation information; and test site specific timing information.

According to some embodiments, the test site specific signal includes: test site identification information; and regulation information, and where the test site identification information associates the regulation information with a specific test site.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 9 is a flow chart depicting an exemplary sequence of computer implemented steps of a computer-controlled process for receiving a trigger signal from an automated test equipment via a real-time tester interface to trigger a temperature control function according to embodiments of the present invention.

FIG. 10 is a flow chart depicting an exemplary sequence of computer implemented steps of a computer-controlled process for providing a test site specific signal to a handler via a real-time handler interface according to embodiments of the present invention.

FIG. 11 is a flow chart depicting an exemplary sequence of computer implemented steps of a computer-controlled process for receiving a test site specific signal from an automated test equipment to control a temperature control function according to embodiments of the present invention.

FIG. 12 is a flow chart depicting an exemplary sequence of computer implemented steps of a computer-controlled process for providing a test site specific signal to an automated test equipment according to embodiments of the present invention.

FIG. 13 is a flow chart depicting an exemplary sequence of computer implemented steps of a computer-controlled process for receiving a test site specific signal from a handler via a real-time handler interface according to embodiments of the present invention.

FIG. 14 is a flow chart depicting an exemplary sequence of computer implemented steps of a process for providing a trigger signal via a real-time handler interface to a handler to trigger a temperature control function according to embodiments of the present invention.

FIG. 15 is a flow chart depicting an exemplary sequence of computer implemented steps that perform a process receiving a trigger signal and an additional signal via a real-time tester interface according to embodiments of the present invention.

DETAILED DESCRIPTION

Figure 1:
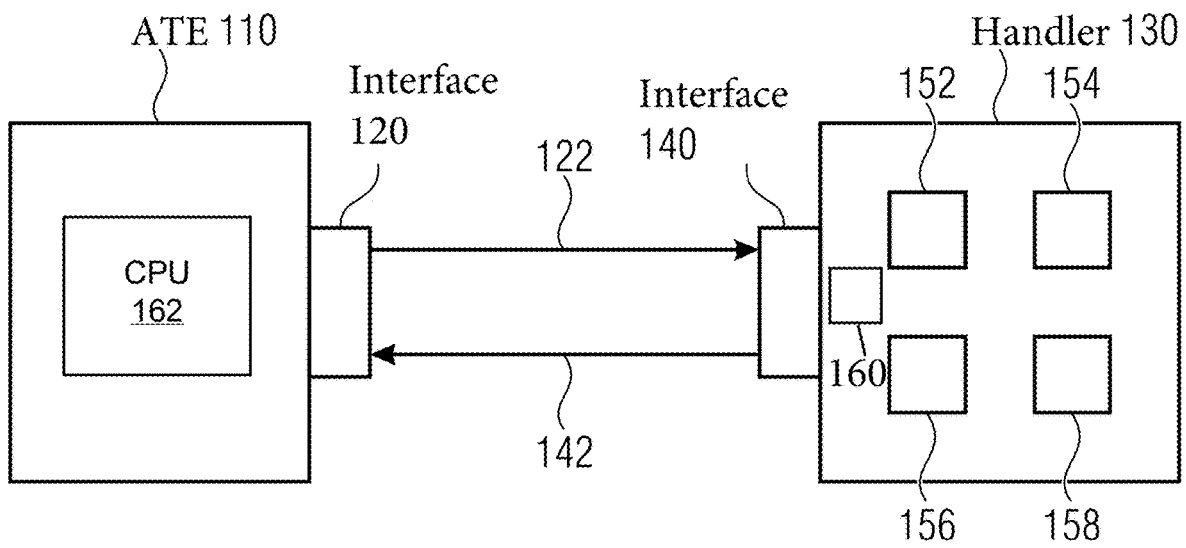
FIG. 1 depicts a top view of exemplary automated test equipment and an exemplary handler according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIGS. 6-15, for instance) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, parameters, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," "labeling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, algorithms, programs, objects, components, data structures, etc. that perform particular tasks or implement particular abstract data types. Typically the functionality of the program modules may be combined or distributed as desired in various embodiments.

Bidirectional Dedicated Interfaces for DUT Testing

Embodiments of the present invention provide systems and methods for testing a device under test using a bidirectional dedicated real-time handler interface. The real-time handler interface is configured to provide a trigger signal to a handler, for example, to trigger a site specific temperature control function. The real-time handler interface is configured to receive the signal from the handler, and the automated test equipment is configured to access, read, process, or analyze the signal received from the handler.

FIG. 1 depicts a top view of exemplary automated test equipment 110 and an exemplary handler 130 according to embodiments of the present invention. FIG. 1 depicts an automated test equipment 110 including a bidirectional dedicated real-time handler interface 120 and a handler 130 including a bidirectional dedicated real-time tester interface 140. Furthermore, FIG. 1 depicts devices under test 152, 154, 156, 158, as an example, arranged on the handler 130. Automated test equipment includes CPU 162 for executing instructions, such as instructions of a test program or test flow, and the CPU an access signals received over the bidirectional dedicated real-time handler interface 120. Automated test equipment 110 can be a test computer system, or a component of a test computer system, for example.

The interfaces 120, 140 are dedicated interfaces such that the handler interface 120 is configured to communicate with the tester interface 140 and vice versa, as the interfaces are bidirectional. In addition, the interfaces 120, 140 are real-time interfaces. Therefore, data transmission times between the interfaces, e.g. a time between the beginning of a sending process of a message at one interface and the end of the arrival of the message at the other interface, may be tailored (e.g., reduced) to increase temperature control timing of a device under test 152, 154, 156, 158. Therefore, information exchanged between automated test equipment 110 and handler 130 may be used for temperature control in real-time, or for other purposes, such as testing adaptation or testing evaluation.

The real-time handler interface 120 is configured to provide a trigger signal 122 to the handler 130 that triggers a temperature control function. The handler 130 can be configured to receive the trigger signal 122 from the automated test equipment 110 via the tester interface 140, and the handler 130 can be configured to trigger the temperature control function in response to the received signal 122.

The handler 130 may be configured to cool and/or heat a device under test 152, 154, 156, 158 to prevent overheating or reach a desired temperature. Trigger signal 122 may include information regarding an upcoming temperature peak of a device under test, and the handler can counteract a thermal hotspot (or even a thermal runaway) of a device under test 152, 154, 156, 158. The handler 130 includes a circuit 160 that can access signals received from the real-time tester interface 140 and can cause the handler 130 to perform tasks according to the signals, such as thermal management tasks, synchronization, etc.

Furthermore, the handler 130 can be configured to provide a signal 142 to the automated test equipment 110 via the tester interface 140, and the real-time handler interface 120 can receive the signal 142 from the handler 130. The automated test equipment 110 accesses and evaluates the signal 142 received from the handler.

The handler may transmit temperature information of a device under test 152, 154, 156, 158 in real-time to the automated test equipment 110. The automated test equipment 110 may access and evaluate this information and adapt a testing process thereto to prevent overheating of a device under test. A test flow may be adapted or modified so that a cooling time for a device under test 152, 154, 156, 158 between two sub tests is increased. In addition, the trigger signal 122 may be adapted based on the signal 142 received to instruct the handler 130 to adapt a temperature management strategy.

According to some embodiments, the bidirectional dedicated real-time handler interface 120 may be configured to provide a synchronization signal to the handler 130. The handler 130 may be configured to receive the synchronization signal via the bidirectional dedicated real-time tester interface 140. Based on the synchronization signal, the handler 130 may perform other functions in synchronization with the automated test equipment 110 beyond triggering of the temperature control function. For example, synchronization may be performed by the automated test equipment 110 to perform measurements, e.g., temperature measurements of devices under test 152, 154, 156, 158, by the handler 130 at a specific time. The measurements may occur with a certain time responsive to a stimulus of a device under test 152, 154, 156, 158. Signal 122 may include the synchronization signal, or the synchronization signal may be transmitted as a separate signal.

According to some embodiments, the bidirectional dedicated real-time handler interface 120 may be configured to provide a test site specific signal to the handler 130. The handler may be configured to receive the test site specific signal from the automated test equipment 110 via the bidirectional dedicated real-time tester interface 140. The handler may control a temperature control function based on or in response to the test site specific signal, such as cooling a specific device under test 152. The signal 142 sent from the handler 130 to the automated test equipment 110 may also be a test site specific signal, such as temperature measurements of a specific test site or device under test 152.

The bidirectional dedicated real-time handler interface 120 may be configured to provide another signal in addition to the trigger signal 122. For example, the handler 130 may be configured to receive an additional signal via the real-time tester interface 140, in addition to the trigger signal 122. The additional signal may include control information may be used for determining or modifying a temperature control profile or temperature regulation by the handler 130, and may include information about one or more measured values determined by the automated test equipment 110, one or more test state parameters, and/or alarm information. The handler 130 may be configured to use the additional signal to control the temperature of one or more device under test sites or devices under test 152, 154, 156, 158. The additional signal may include any information that can be used to improve the testing of the devices under test.

The test state parameters may include timing information of upcoming power supply changes for the devices under test 152, 154, 156, 158, and the handler 130 may adapt its cooling strategy for the devices based on the timing information. Furthermore, the handler may be configured to evaluate such information to decide how to adapt the temperature management. The additional signal may be a direct temperature management strategy informing the handler when and where to cool based on the timing information, for example. When a device under test malfunctions, the handler 130 may immediately cool a device under test to prevent damage or aborting a test.

The automated test equipment 110 may be configured to adjust a test flow in response to the signal 142 received from the handler. The handler may provide information, e.g., temperature information, about devices under test 152, 154, 156, 15 that can be used to adjust testing. For example, when the temperature of a device under test rises, the automated test equipment 110 may extend a delay period between two tests for to allow the device to cool down and/or to prevent the device from reaching a critical temperature.

The automated test equipment 110 may be configured to interrupt a test in reaction to the signal 142 from the handler. In other words, the signal 142 provided by the handler may be an interruption signal. The automated test equipment 110 may interrupt a test in response or in reaction to the signal 142, for example, based on an evaluation of a temperature measurement of the handler, by the handler, or based on an over temperature alert or alarm information provided by the handler 130. The handler 130 may also be configured to provide a test site specific interruption signal to the automated test equipment via the tester interface to allow an individual test interruption for a specific device under test allowing tests of other devices under test to continue. Accordingly, the automated test equipment may be configured to generate a test site specific interrupt to interrupt a test in response to receiving the test site specific signal from the handler.

The signal 142 provided by the handler 130 may be a deactivation signal, for example, for deactivating a power supply of one or more devices under test. In some cases, the handler 130 may not be able to prevent overheating of a device under test, e.g., in the case of a malfunction. Therefore, the handler may evaluate measurement data, and may send the deactivation signal to the automated test equipment 110 to stop the power supply of the device under test. In general, the handler may be configured to detect a malfunction, e.g., a device under test malfunction or a temperature control malfunction, and may provide information to the automated test equipment 110 via signal 142, such as a deactivation signal. Accordingly, the automated test equipment may be configured to deactivate a power supply of one or more devices under test in response to receiving a signal from the handler.

To prevent shutdown, the handler 130 may be configured to provide a temperature warning signal to the automated test equipment 110 via the tester interface 140. The automated test equipment can receive the temperature warning signal and adapt the testing to prevent overheating of a device under test 152, 154, 156, 158. Therefore, the handler 130 may be configured to evaluate behavior or temperature measurements of devices under test during testing.

The automated test equipment 110 may be configured to receive a test site specific signal from the handler 130. The handler may be configured to provide the test site specific signal to the automated test equipment via the tester interface 140. Test functions may be performed individually for a specific device under test or test site, such as individual cooling strategies, power shutdowns, delay time adaptation, etc.

The handler 130 may be configured to handle the data of the device under test using the signal 142 transmitted to the automated test equipment 110 via the real-time tester interface 140. The automated test equipment 110 may be configured handle the data of a device under test in response to a reception of the signal 142 from the handler 130, for example. The handler may trigger a beginning or an end of a data record, such as when a malfunction or other event is detected, and the data may be recorded and stored for failure analyses. On the other hand, data recording can be stopped when a malfunction or overheating occurs, such as when the power supply to a device shuts down, which may render any measurement data taken thereafter useless.

The handler 130 may be configured to provide a signal to the automated test equipment 110 via the tester interface 140 for logging by the automated test equipment 110. The automated test equipment 110 may be configured to log the signal received from the handler 130. The signal may include measurement data, e.g., temperature information, to be stored by the automated test equipment. Based on such data, a test evaluation may be performed.

According to some embodiments, the handler 130 is configured to provide a signal to the automated test 110 equipment via the tester interface in real-time for enabling a real-time reaction of the automated testing equipment 110 in response to the signal provided. For example, signal 142 may be provided in real-time. As an example, the automated test equipment 110 may be configured to react in real-time in response to the signal received by the handler 130. Providing handler information in real-time and reacting in real-time allows for more efficient testing that can be adapted and evaluated in real-time.

Some elements depicted in the example of FIG. 1, such as the automated test equipment 110 and the handler 130, may include a test cell or a test system, according to some embodiments of the present invention. According to other embodiments, automated test equipment 110 and handler 130 may be used individually. Signal 122, 142 may be transmitted over a common wire, or over separate wires, according to embodiments.

Figure 2:
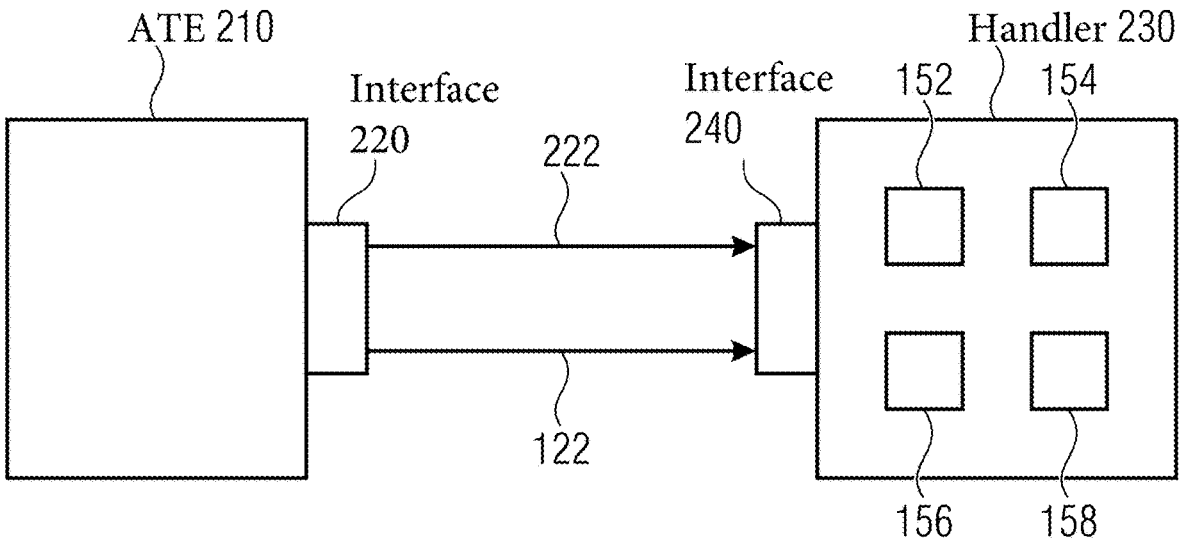
FIG. 2 depicts a top view of exemplary automated test equipment and an exemplary handler using real-time interfaces according to embodiments of the present invention.

FIG. 2 depicts a top view of exemplary automated test equipment 210 and an exemplary handler 230 using real-time interfaces 220, 240 according to embodiments of the present invention. FIG. 2 depicts an automated test equipment 210 including a real-time handler interface 220 and a handler 230, including a real-time tester interface 240. Furthermore, FIG. 2 depicts devices under test 152, 154, 156, 158, as an example, arranged on the handler 230.

In the example of FIG. 2, interfaces 220, 240 are real-time interfaces. Therefore, data transmission time between the interfaces, e.g. the time between the beginning of sending a message at the handler interface 220 and the end of the arrival of the message at the tester interface 240, can be reduced to increase temperature control timing of a device under test 152, 154, 156, 158, and information sent from the automated test equipment 210 to the handler 230 may be used for temperature control in real-time.

The real-time handler interface 220 is configured to provide a trigger signal 122 to the handler 230 to trigger a temperature control function. The handler 230 is configured to receive the trigger signal 122 from the automated test equipment 210 via the tester interface 240, and the handler

230 is configured to trigger the temperature control function in response to the received signal 122.

The handler 230 may be configured to cool and/or heat a device under test 152, 154, 156, 158, for example, to prevent overheating. Trigger signal 122 may include information about an upcoming temperature peak of a device under test so that the handler can act to counter or prevent a thermal hotspot (or even thermal runaway) of a device under test 152, 154, 156, 158.

The real-time handler interface 220 is configured to provide a synchronization signal 222 to the handler 230 to synchronize functions of the handler 230 beyond the triggering of the temperature control function. For example, the handler 230 is configured to receive the synchronization signal 222 from the automated test equipment 210 via the tester interface 240, and to synchronize functionality with the automated test equipment 210 in response to the received synchronization signal 222.

Some applications, e.g., thermal diode calibration, may require fast and precise synchronization timing between the handler 230 and the automated test equipment 210 to measure the temperature at the correct time. The synchronization signal 222 may be used to inform the handler 230 precisely when to measure. This enables more precise testing as a stimulus of a device under test can be aligned with a corresponding measurement of the handler 230.

According to some embodiments, the real-time handler interface 220 may be configured to perform active synchronization with the handler based on the synchronization signal 222 to the handler. The active synchronization may include synchronization without using wait insertions. The handler 230 may be configured to receive a signal from the automated test equipment 210 via the tester interface 240, e.g., the synchronization signal 222, for active synchronization with the automated test equipment 210. The handler may be configured to perform the active synchronization with the automated test equipment based on the synchronization signal. This enables synchronizing handler 230 and automated test equipment 210 to test faster and more accurately without having to perform wait statements to achieve synchronization, which can reduce testing time and provide synchronization with very limited delay.

The real-time handler interface 220 may be configured to transmit calibration timing information to the handler 230, and to determine the timing for calibrating the handler 230. The handler 230 may be configured to receive the calibration timing information, e.g., via the synchronization signal 222, from the automated test equipment 210 via the tester interface 240, to determine a calibration timing. Furthermore, the handler 230 may be configured to determine the calibration timing, based on the calibration timing information. Calibration may be performed to compensate for errors. For example, a first measurement may be performed at a first state of a device under test and the measurement data can be used to compensate for (e.g., offset) subsequent measurements to increase measurement and/or testing accuracy.

The real-time handler interface 220 may be configured to transmit a signal indicating that a device under test is powered, biased, or initialized in a predetermined manner, for example, using the synchronization signal 222. The handler 230 may be configured to receive the signal from the automated test equipment 210 via the tester interface 240 indicating that the device under test is conditioned, powered, biased, or initialized in the predetermined manner. As explained above, the information of a device under test being powered, biased, or initialized in a predetermined manner may be used to calibrate subsequent measurements.

According to some embodiments, the real-time handler interface 220 may be configured to transmit signals when different devices are tested or when specific test conditions are reached. The handler may be configured to receive the signals from the automated test equipment 210 via the tester interface 240 to synchronize automated test equipment 210 and handler 230, for example, using synchronization signal 222 or a separate signal.

The automated test equipment 210 may be configured to provide the synchronization signal 222 to trigger one or more temperature readings by the handler 230. The handler 230 may be configured to receive a signal, for example the synchronization signal 222, from the automated test equipment 210 via the tester interface 240, and to calibrate or perform one or more temperature measurements based on the synchronization signal. The automated test equipment may execute a testing routine, and may provide stimuli to the devices under test. For testing, temperatures of the devices may have to be measured when the devices are in certain predetermined states. Based on the testing routine and current stimulus, the automated test equipment may start synchronization by instructing the handler 230 via the synchronization signal 222 to perform a measurement. Since the interfaces are real-time interface, the instruction can be transmitted quickly enough to perform synchronous measurements such that a measurement may be performed when a respective device is in its predetermined state as prescribed by the testing routine, e.g., before the state of the device changes.

The real-time handler interface may be configured to enable thermal diode calibration based on the synchronization signal to the handler 230. The thermal diode calibration may include a delta temperature measurement and the real-time handler interface 220 may be configured to transmit real-time measurement timing information to the handler 230 for thermal diode calibration.

The handler 230 may be configured to perform the thermal diode calibration based on the synchronization signal 222 received from the automated test 210 equipment via the tester interface 240. The thermal diode calibration may include a delta temperature measurement and the handler 230 may be configured to perform the delta temperature measurement. Moreover, the handler may be configured to receive real-time measurement timing information from the automated test equipment via the real-time tester interface for the thermal diode calibration.

The synchronization signal 222 may include test site specific time information for measurements of the handler 230. The synchronization signal includes test site specific test state information or device state information, for example. The automated test equipment 210 may inform the handler 230 about an upcoming event, which may require certain measurements to be performed by the handler 210.

According to some embodiment, some elements shown in the example of FIG. 2 may include a test cell or a test system, such as the automated test equipment 210 and the handler 230. Automated test equipment 210 and handler 230 may be used individually. Signal 122, 222 may be transmitted over a common wire, or over separate wires, according to embodiments.

Figure 3:
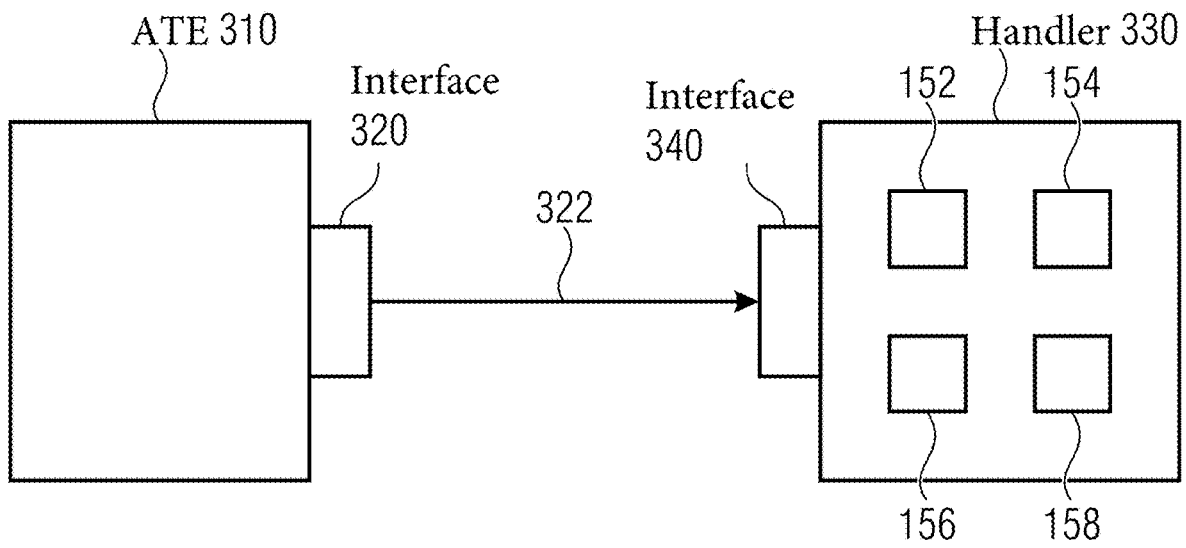
FIG. 3 depicts a top view of exemplary automated test equipment and exemplary handler using a test site specific signal according to embodiments of the present invention.

FIG. 3 depicts a top view of exemplary automated test equipment 310 and exemplary handler using a test site specific signal 322 according to embodiments of the present invention. FIG. 3 depicts an automated test equipment 310 including a real-time handler interface 320 and a handler 330, including a real-time tester interface 340. FIG. 3 also depicts devices under test 152, 154, 156, 158 arranged on the handler 330 as an example.

The interfaces 320, 340 are real-time interfaces. Therefore, data transmission times between the interfaces may be reduced to increase a temperature control timing of a device under test 152, 154, 156, 158, and information sent from the automated test equipment 310 to the handler 330 may be used for temperature control in real-time.

The real-time handler interface 320 is configured to provide a test site specific signal 322 to the handler 330 for a temperature control function, and the handler 330 is configured to receive the signal 322 from the automated test equipment 310 via the tester interface 340. The handler 330 can control temperatures in response to the received test site specific signal 322.

Devices under test 152, 154, 156, 158 may show different behavior, e.g., different temperature trends and responses while testing. Therefore, the automated test equipment 310 may provide test site specific information for adapting the temperature regulation of the devices under test. The handler may adapt the cooling order and magnitude of devices or test sites according to the information. Adapting testing to individual test sites can substantially increase testing efficiency.

As an example, signal 322 may include information regarding an upcoming temperature peak of a specific device under test so that the handler can act to counter or prevent a thermal hotspot (or even a thermal runaway) of the device.

Test site specific signal 322 may include one or more of the following: a test site specific alarm, test site specific trigger identification information, test site specific temperature adjustment information, test site specific setup information, test site specific heat dissipation information, and/or test site specific timing information. Any information that can be used to improve testing efficiency and accuracy may be transmitted using test site specific signal 322. An alarm may be sent to the handler when the automated test equipment 310 determines a temperature hotspot, a device malfunction, or thermal runaway. Based on test site specific setup information, the handler 330 may schedule cooling operations to optimally cool each device under test 152, 154, 156, 158. Similarly, heat dissipation and timing information may be included in test site specific signal 322, such as the estimated or expected heat that a device may dissipate according to a scheduled test or test stimulus, when the heat will be dissipated, or when the handler should cool a certain device, which can improve testing efficiency and thermal management.

The test site specific signal may include test site identification information and regulation information that can be associated with a test site. Temperature management strategies may be implemented individually for each test site or device under test 152, 154, 156, 158 to improve testing efficiency.

According to some embodiments, the test site identification information includes a test site ID, and the test site ID can be modulated on to the test site specific signal. The test site ID can identify a specific test site or device under test. A modulation of the test site ID may allow embodiments to use a single transmission line, e.g., a single trigger line, which can reduce wiring. Based on the ID, the handler 330 can determine which test site acts in response to the trigger signal or signal 322.

The regulation information may include timing information and/or control amplitude information. Based on the regulation information, the handler 330 can perform cooling/heating in order to keep the devices under test within a desirable temperature interval.

According to some embodiments, the automated test equipment 310 may be configured to provide a single trigger signal for a plurality of test sites with site-specific delay information describing delays between a trigger event and the beginning of thermal preconditioning operations performed for different test sites. The handler 330 may be configured to receive the single trigger signal from the automated test equipment 310 via the tester interface 320. In this way, the signal may be produced more efficiently for faster signal transmission. The automated test equipment 310 may estimate or predict the occurrence an upcoming temperature trend for a plurality of devices under test 152, 154, 156, 158 and may determine, based thereon, adequate delays, e.g., cooling delays, so that no device under test experiences thermal runaway. Accordingly, embodiments can delay the beginning of a testing operation or trigger event (e.g., an increase in power supply or a thermal preconditioning operation). Moreover, devices may be given enough time to cool down to a desirable temperature in between tests.

The automated test equipment 310 may be configured to execute test flows of different test sites so that corresponding states are reached at different times in different test flows, and the automated test equipment 310 can provide the site-specific signal in response to reaching predetermined states of the respective test flows. The handler 330 can access the current state of each device under test 152, 154, 156, 158, and can schedule adequate cooling operations accordingly. Moreover, the handler may be configured to start a cooling process for a device under test before temperature rises, for example, based on a trigger signal including information pertaining to expected upcoming changes in temperature. For example, the information can be based on a current or upcoming event, or a predetermined test state in a testing sequence. In addition, devices under test that receive a relatively high amount of power may be selected to perform more frequent temperature measurements to monitor temperatures and prevent overheating.

Some elements depicted in the example of FIG. 3 may include a test cell or a test system, such as the automated test equipment 310 and/or the handler 330. Automated test equipment 310 and handler 330 may be used separately and individually, according to embodiments.

Figure 4:
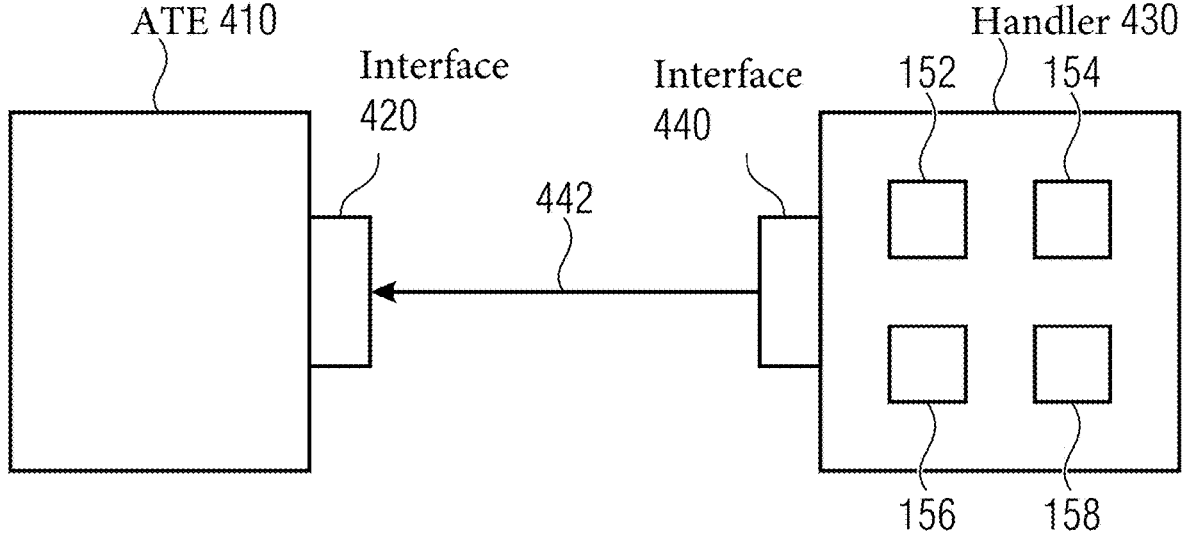
FIG. 4 depicts a top view of exemplary automated test equipment and an exemplary handler using real-time interfaces and a test site specific signal according to embodiments of the present invention.

FIG. 4 depicts a top view of exemplary automated test equipment 410 and an exemplary handler 430 using real-time interfaces 420, 440 and a test site specific signal 422 according to embodiments of the present invention. FIG. 4 depicts an automated test equipment 410 including a real-time handler interface 420 and a handler 430 that includes a real-time tester interface 440. FIG. 4 depicts exemplary devices under test 152, 154, 156, 158 arranged on the handler 430.

The interfaces 420, 440 are real-time interfaces. Data transmission times between the interfaces may be reduced to increase a temperature control timing of a device under test 152, 154, 156, 158. Information sent from the handler 430 to the automated test equipment 410 may be used for temperature control in real-time.

The real-time tester interface 440 is configured to provide the test site specific signal 442 to the automated test equipment 410, and the automated test equipment 410 is configured to receive the signal 442 from handler 430 via the handler interface 420.

Devices under test 152, 154, 156, 158 may exhibit different characteristics, e.g., different temperature trends, while testing. Accordingly, the handler 430 may provide test site specific information for adapting the temperature regulation or testing schedule of the devices under test. For example, the handler may provide individual temperatures of the devices under test 152, 154, 156, 158 for the automated test equipment 410 under certain conditions. The automated test equipment 410 may therefor adapt delays between different tests for devices or test sites according to the information to increase testing efficiency.

According to some embodiments, the handler 430 may be configured to detect a temperature malfunction. This may occur when a temperature gradient exceeds a specific predetermined threshold or predefined gradient. The test site specific signal may be a test site specific alarm, and the handler 430 may be configured to enable a test site specific alarm handling and/or a test site specific shutdown. The automated test equipment 410 may, optionally, be configured to handle the test site specific alarm and/or to perform a test site specific shutdown based on the test site specific alarm. As an example, the handler can detect a large temperature difference between measurements of a device under test 152. The difference may exceed a threshold, and the handler may issue an alert for device 152 or the associated test equipment. For example, a test site specific alarm may be transmitted via signal 442 to the automated test equipment 410. The automated test equipment 410 may then shut down the specific test site (e.g., the test site associated with device 152) to avert damage to the device and to enable further testing of the remaining devices under test 154, 156, 158.

The handler 430 may be configured to adapt or influence the data handling, e.g., the binning and datalogging, of the device under test using the signal 442 transmitted to the automated test equipment 410 via the real-time tester interface 440. The automated test equipment 410 may be configured to influence the data handling of the device under test in response to a reception of a signal, e.g., a test site specific signal, from the handler 430. As an example, the handler 430 can detect a malfunction of a device under test as explained above and may therefore instruct the automated test equipment to prevent logging corrupted or inaccurate data.

The test site specific signal 442 may include a combination of test site identification information and regulation information, and the test site identification information may be used to associate the regulation information with a specific test site. As an example, a signal 442 may include a syntax element identifying a particular test site or device under test that is associated with thermal management information, such as cooling amplitude or timing information (e.g., how long to cool and when to cool). In this way, testing may be performed with suitable thermal management for each device under test.

The test site identification information may include a test site ID, and the test site ID can be modulated onto the test site specific signal 442. Modulation of the test site ID may allow for a single trigger line and may reduce wiring complexity, especially for a signaling a plurality of test sites.

The regulation information can include timing information, e.g., for determining when to cool, heat, delay, or for controlling amplitude information. This can allow for improved thermal management of the devices under test.

Some elements shown in FIG. 4 may include a test cell or test system, such as the automated test equipment 410 and the handler 430, according to some embodiments. Automated test equipment 410 and handler 430 may be used individually as well.

Figure 5:
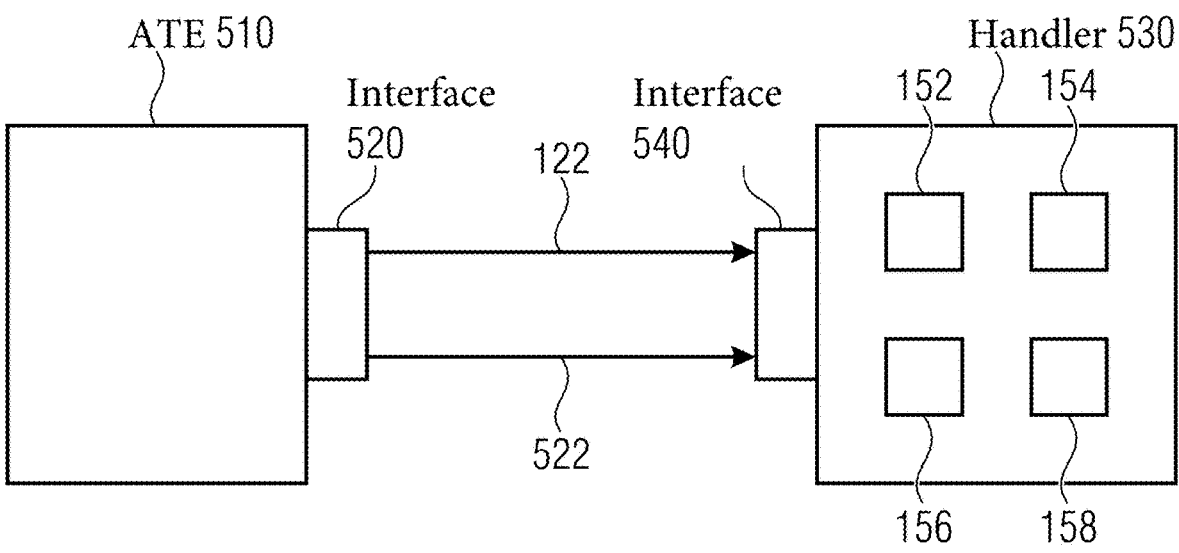
FIG. 5 depicts automated test equipment including a real-time handler interface and a handler including a real-time tester interface according to embodiments of the present invention.

FIG. 5 depicts automated test equipment 510 including a real-time handler interface 520 and a handler 530 including a real-time tester interface 540, according to embodiments of the present invention. In the example of FIG. 5, exemplary devices under test 152 154, 156, 158 are arranged on the handler 530.

The interfaces 520, 540 are real-time interfaces. Data transmission time between the interfaces can be reduced to increase a temperature control timing of a device under test 152, 154, 156, 158. Accordingly, information sent from the automated test equipment 510 to the handler 530 may be used for temperature control in real-time.

The real-time handler interface 520 is configured to provide a trigger signal 122 to the handler 530 to trigger a temperature control function. The handler 530 is configured to receive the trigger signal 122 from the automated test equipment 510 via the tester interface 540, and the handler 530 is configured to trigger the temperature control function in response to the received signal 122.

The handler 530 may be configured to cool and/or heat a device under test 152, 154, 156, 158 to prevent overheating. Trigger signal 122 may include information regarding an upcoming temperature peak of a device under test, and the handler can counteract or prevent a thermal hotspot (or even a thermal runaway) of a device under test 152, 154, 156, 158.

Furthermore, the real-time handler interface 520 may be configured to provide an additional signal 522, in addition to the trigger signal 122. The handler 530 may be configured to receive, via the real-time tester interface 540, the trigger signal 122 and, in addition to the trigger signal, the additional signal 522. The additional signal may include control information used to determine or modify a temperature control profile or temperature regulation by the handler, information regarding one or more measured values determined by the automated test equipment or extracted from a device under test data stream by the automated test equipment, test state parameters, and/or alarm information.

Based on the testing to be performed, the automated test equipment 510 may determine, predict, or evaluate the additional signal 522 to coordinate interactions of the handler 530 with the devices under test 152, 154, 156, 158. The automated test equipment 510 may predict rising temperatures of a device under test, for example, due to a scheduled increase in that amount of power provided, and may determine control information for use by the handler to prevent the temperature from reaching an undesirable level. This may include adjusting the cooling amplitude and/or cooling duration of the device under test. Furthermore, the automated test equipment 510 may determine information regarding one or more measured variables and/or one or more test state parameters. The automated test equipment 510 may determine or evaluate a current or predicted behavior of a device under test and provide and information to the handler 530 for manipulating the device under test. For example, for data evaluation, automated test equipment 510 determines a critical state, e.g., an overtemperature, of a device under test, and alarm information may be provided to the handler 530 to allow the handler to adapt the management of the device, e.g., thermal management.

According to some embodiments, handler 530 may be configured to determine a temperature control profile or temperature regulation profile, and the handler 530 may be configured to determine a cooling amplitude and/or a duration and/or a cooling strength for the determination of the temperature control profile or temperature regulation profile. The handler may evaluate the information provided by the automated test equipment 510, e.g., in the form of trigger signal 122, or of additional signal 522 to determine the temperature management characteristics. Alternatively, such information may be evaluated by the automated test equipment and transmitted directly, e.g., without the handler having to determine the information.

According to some embodiments, the automated test equipment may be configured to extract a measured value or parameter from a digital data stream of the device under test, and the real-time handler interface is configured to transmit the measured value or parameter to the handler via the real-time handler interface. The automated test equipment may be configured to transmit a value or parameter measured by an instrument of the automated test equipment to the handler via the handler interface. As described above, the handler 530 may evaluate, based on said measured value, a state of a device under test, or a cooling amplitude and/or cooling strength, which can improve thermal management during testing.

According to some embodiments, the real-time handler interface 520 may be configured to provide the additional signal 522 and/or trigger signal 122 with a latency below 1 ms, below 100 microseconds, below 10 microseconds, or below 1 microsecond, in different configurations. For example, the interfaces may run at a low latency for rapidly adapting the thermal management of the handler. The low latency data may be recent enough upon arrival to quickly counteract potential undesirable events of a device under test, such as overheating.

According to some embodiments, the real-time handler interface 520 may be configured to provide bandwidth so that the latency of the additional signal and/or of the trigger signal provided by the real-time handler interface is lower than a control loop timing of a temperature control function. With data or signal transmission being faster than the control loop timing, information transmitted may be used to improve or adapt the temperature regulation.

According to some embodiments, the temperature control functions may use a control loop including the handler interface 520 and/or the tester interface 540. The temperature control functions may be configured to consider real-time information that is transmitted via the handler interface 520 and/or that may be received via the tester interface 540. For example, to provide robust and responsive temperature control, the control loop may be provided with a plurality of information. Therefore, handler interface 520 and/or tester interface 540 may be part of the control loop providing measurement data and/or evaluated parameters. Consequently, the current state of a device under test may be calculated, and a temperature of a device under test may be regulated based on a space state model. The model may be used for any kind of control. With the large amount of information, predictive control concepts may be implemented, e.g., based on estimated states similar to or associated with a current or estimated temperature of a device under test. This may allow for robust and precise temperature control.

According to some embodiments, the control loop may include the automated test equipment 510, and the automated test equipment 510 may be configured to be part of an integrated regulation in combination with the handler. The control loop may include the handler, and the handler may be configured to be a part of an integrated regulator in combination with the automated test equipment. As explained above, a temperature control concept or function may include all elements, e.g. the automated test equipment and/or the handler, to aggregate all information channels available, such as the measurement data of the handler, or the upcoming tests of a testing cycle. Therefore, testing efficiency is improved and adequate thermal management conditions are maintained.

According to some embodiments, the real-time handler interface 520 and/or the real-time tester interface 540 may be configured to provide said trigger 122 and/or additional signal 522 for real-time temperature control. For example, when interfaces 520, 540 are bidirectional, both may be configured to provide the signals 122, 522. The flow of information may be chosen according to constraints of the specific application.

According to some embodiments, the handler 530 may include temperature control functionality. The handler may be configured to cool and/or heat devices under test 152, 154, 156, 158. Therefore, the handler may be or may include the control element of the control loop. In addition, using the information being transmitted via trigger signal 122 and trigger signal 522 from automated test equipment 510 to the handler 530, the handler may determine an input variable for the temperature controller.

According to some embodiments, the real-time handler interface is part of a temperature regulation loop. According to other embodiments, the real-time tester interface is part of a temperature regulation loop.

According to some embodiments, the automated test equipment 510 and/or the handler 530 may be configured to implement integrated regulation functionality distributed between the automated test equipment and a handler. The automated test equipment and/or the handler can calculate an input variable for use by a regulator or for scheduling temperature control inputs. Calculation of regulation data may be distributed in a time efficient way to minimize data transmission between the automated test equipment and the handler, for example, so that the majority of data transmitted includes final results required by the element receiving the data.

According to some embodiments, the automated test equipment 510 may be configured to affect a regulation using a pattern provided by a pattern generator of the automated test equipment.

The elements shown in FIG. 5 may be a test cell or test system, including the automated test equipment 510 and the handler 530 according to embodiments of the invention. However automated test equipment 510 and handler 530 may be used individually according to the invention. The signal 122, 522 may be made via common wire, or via separate wires.

Figure 6:
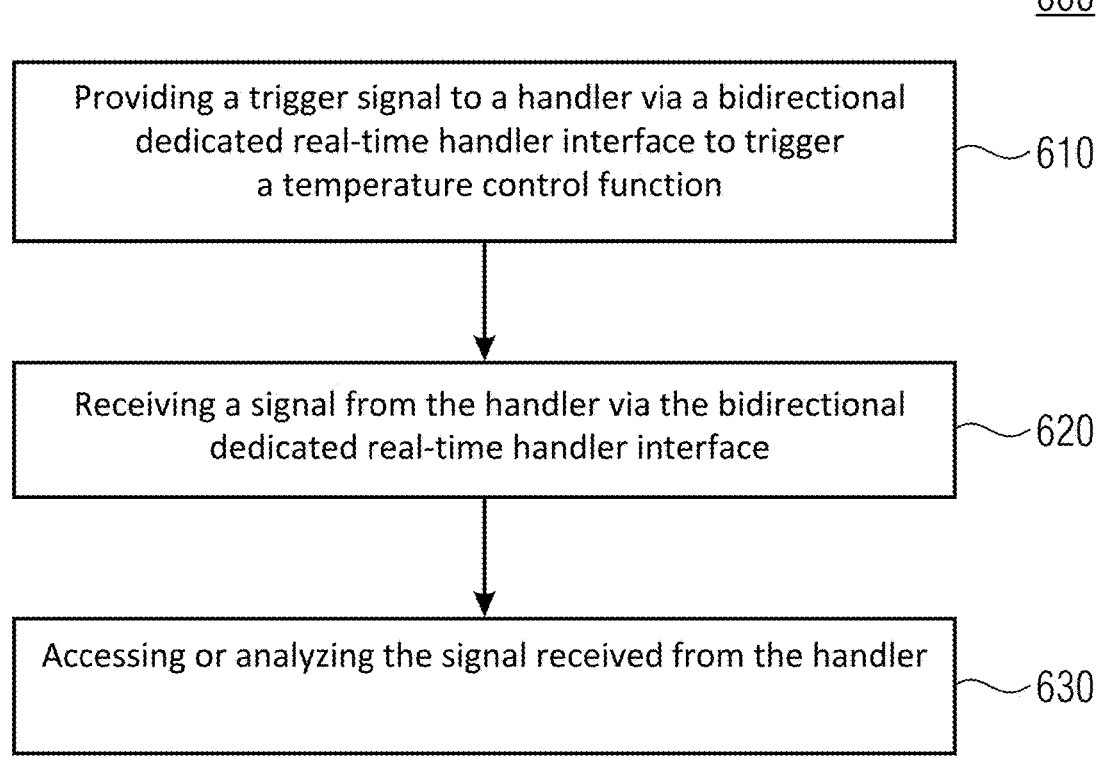
FIG. 6 is a flow chart depicting an exemplary sequence of computer implemented steps of a computer-controlled process for providing a trigger signal to a bidirectional dedicated real-time handler interface according to embodiments of the present invention.

FIG. 6 is a flow chart depicting an exemplary sequence of computer implemented steps of a computer-controlled process 600 for providing a trigger signal to a bidirectional dedicated real-time handler interface according to embodiments of the present invention. Process 600 includes step 610 providing a trigger signal to a handler via a bidirectional dedicated real-time handler interface to trigger a temperature control function, step 620 receiving a signal from the handler via the bidirectional dedicated real-time handler interface, and step 630 accessing, analyzing, or evaluating the signal received from the handler.

Figure 7:
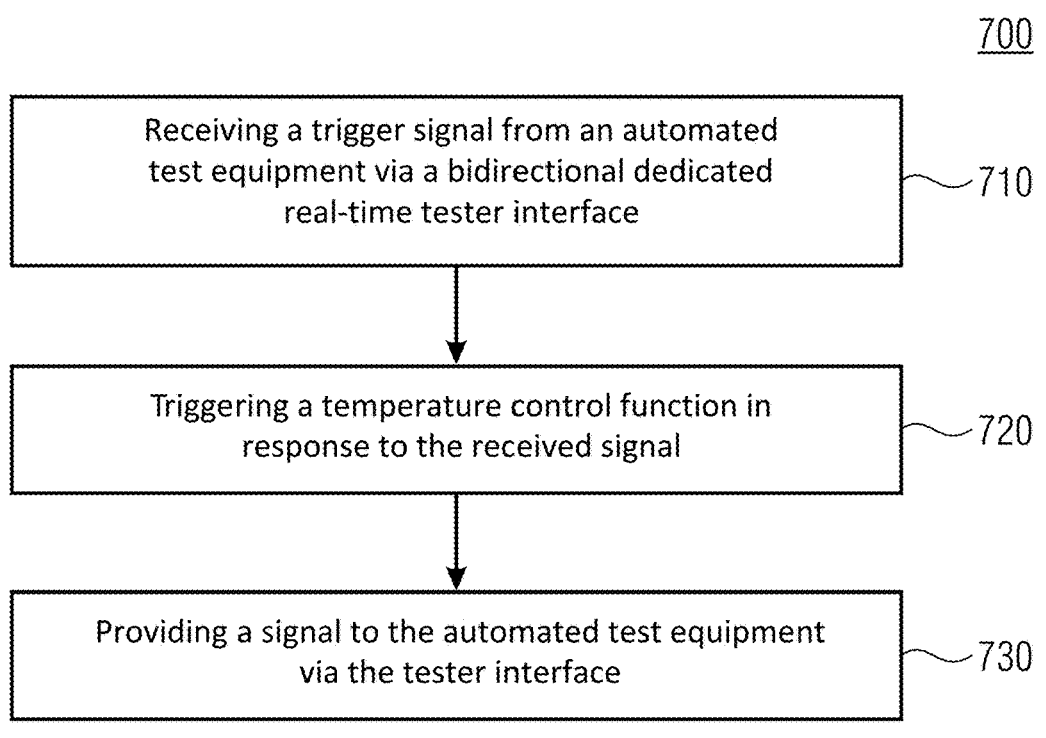
FIG. 7 is a flow chart depicting an exemplary sequence of computer implemented steps of a computer-controlled process for receiving a trigger signal from an automated test equipment via a bidirectional dedicated real-time tester interface according to embodiments of the present invention.

FIG. 7 is a flow chart depicting an exemplary sequence of computer implemented steps of a computer-controlled process 700 for receiving a trigger signal from an automated test equipment via a bidirectional dedicated real-time tester interface according to embodiments of the present invention. Process 700 includes step 710 receiving a trigger signal from an automated test equipment via a bidirectional dedicated real-time tester interface, step 720 triggering a temperature control function in response to the received signal, and step 730 providing a signal to the automated test equipment via the tester interface.

Figure 8:
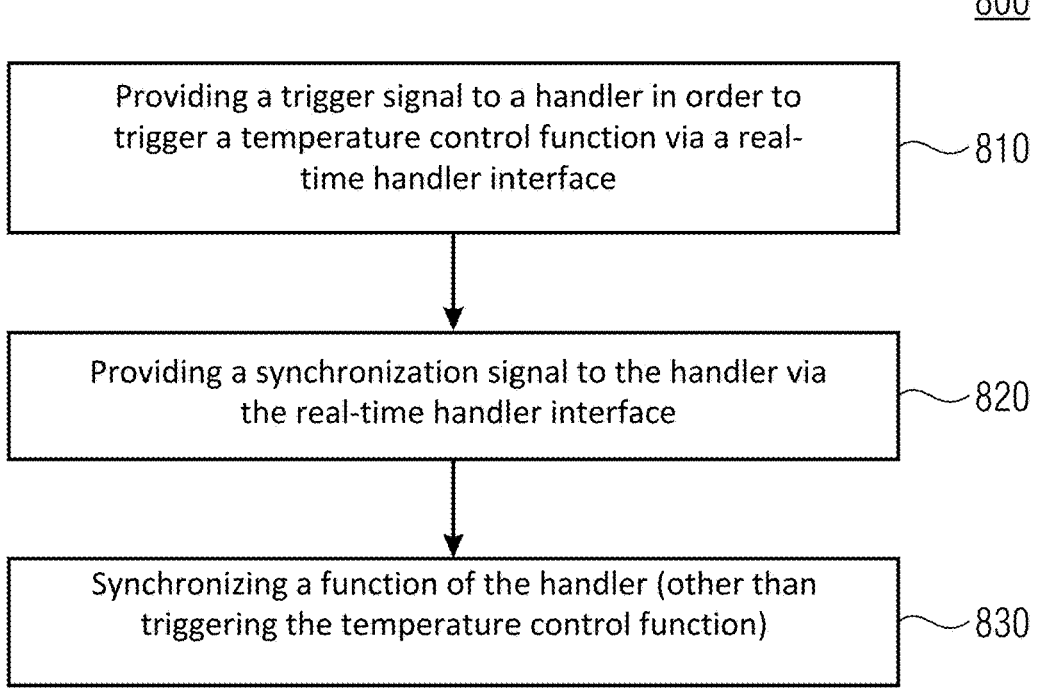
FIG. 8 is a flow chart depicting an exemplary sequence of computer implemented steps of a computer-controlled process for receiving a trigger signal from an automated test equipment via a bidirectional dedicated real-time tester interface according to embodiments of the present invention.

FIG. 8 is a flow chart depicting an exemplary sequence of computer implemented steps of a computer-controlled process 800 for receiving a trigger signal from an automated test equipment via a bidirectional dedicated real-time tester interface according to embodiments of the present invention. Process 800 includes step 810 providing a trigger signal to a handler to trigger a temperature control function via a real-time handler interface, step 820 providing a synchronization signal to the handler via the real-time handler interface, and step 830 synchronizing another function of the handler (other than triggering the temperature control function).

FIG. 9 is a flow chart depicting an exemplary sequence of computer implemented steps of a computer-controlled process 900 for receiving a trigger signal from an automated test equipment via a real-time tester interface to trigger a temperature control function according to embodiments of the present invention. Process 900 includes step 910 receiving a trigger signal from an automated test equipment via a real-time tester interface, step 920 triggering a temperature control function in response to the received trigger signal, step 930 receiving a synchronization signal from the automated test equipment via the tester interface, and step 940 synchronizing another function with the automated test equipment (other than triggering a temperature control function in response to the received synchronization signal).

FIG. 10 is a flow chart depicting an exemplary sequence of computer implemented steps of a computer-controlled process 1000 for providing a test site specific signal to a handler via a real-time handler interface according to embodiments of the present invention. Process 1000 includes step 1010 providing a test site specific signal to a handler via a real-time handler interface to control a temperature control function.

FIG. 11 is a flow chart depicting an exemplary sequence of computer implemented steps of a computer-controlled process 1100 for receiving a test site specific signal from an automated test equipment to control a temperature control function according to embodiments of the present invention. Process 1100 includes step 1110 receiving a test site specific signal from an automated test equipment via a tester interface and step 1120 controlling a temperature control function in response to the received test site specific signal.

FIG. 12 is a flow chart depicting an exemplary sequence of computer implemented steps of a computer-controlled process 1200 for providing a test site specific signal to an automated test equipment according to embodiments of the present invention. Process 1200 includes step 1210 providing a test site specific signal to an automated test equipment via a real-time tester interface.

FIG. 13 is a flow chart depicting an exemplary sequence of computer implemented steps of a computer-controlled process 1300 for receiving a test site specific signal from a handler via a real-time handler interface according to embodiments of the present invention. Process 1300 includes step 1310 receiving a test site specific signal from a handler via a real-time handler interface.

FIG. 14 is a flow chart depicting an exemplary sequence of computer implemented steps of a process 1400 for providing a trigger signal via a real-time handler interface to a handler to trigger a temperature control function according to embodiments of the present invention. Process 1400 includes step 1410 providing a trigger signal via a real-time handler interface to a handler, to trigger a temperature control function, and step 1420 providing an additional signal, in addition to the trigger signal via the real-time handler interface the additional signal including a control information for a determination or modification of a temperature control profile or temperature regulation by the handler, and/or an information about one or more measured values determined by the automated test equipment or extracted from a device under test data stream by the automated test equipment, and/or one or more test state parameters; and/or an alarm information.

FIG. 15 is a flow chart depicting an exemplary sequence of computer implemented steps that perform a process 1500 of receiving a trigger signal and an additional signal via a real-time tester interface according to embodiments of the present invention. Process 1500 includes step 1510 receiving, via a real-time tester interface, a trigger signal, and, in addition to the trigger signal, an additional signal which includes a control information for a determination or modification of a temperature control profile or a temperature regulation by the handler and/or an information about one or more measured values determined by the automated test equipment or extracted from a device under test data stream by the automated test equipment, and/or an alarm information and/or one or more test state parameters, and step 1520 using the additional signal to control the temperature of one or more devices under test sites.

It should also be noted that the present disclosure describes, explicitly or implicitly, features usable in an automated test system or test cell. Thus, any of the features described herein can be used in the context of an automated test equipment for testing one or more devices under test or in a handler or in an automated test system or in a test cell for testing one or more devices under test (e.g., simultaneously or in a temporally overlapping manner at different sites).

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the present invention include a data carrier having electronically readable control signals, which are capable of cooperating with a programmable computer system, such that one of the methods described herein is performed.

Active temperature control (ATC) can be implemented as hardware and/or software. For example, hardware can be used to measure the temperature and software can be used to control the temperature. The ATC is (or includes) a control loop going from handler to automated test equipment or tester to device and back, which allows the handler to measure the device DIE temperature directly in the device.

In generally, the handler may measure the temperature on outside of device. The ATC measures the templates (or the temperature) by the Thermal diode in the DUT (e.g., device under test) and provides feedforward control or feedback control.

Figure 16:
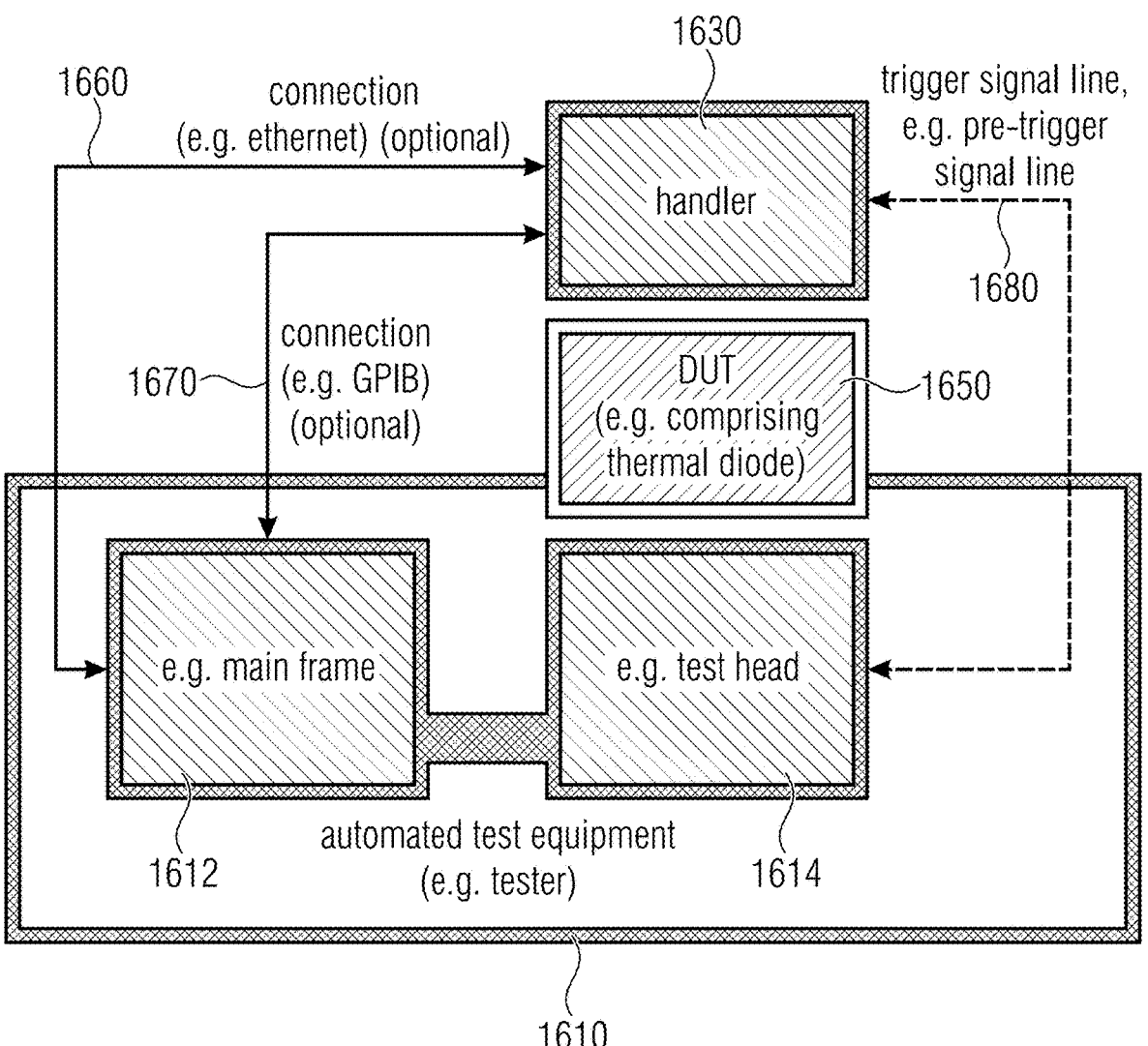
FIG. 16 is a block diagram depicting an exemplary automated test equipment and a handler with a test head according to embodiments of the invention.

FIG. 16 is a diagram depicting an exemplary automated test equipment 1610 and a handler 130 with a test head 1614 according to embodiments of the invention. FIG. 16 depicts an automated test equipment 1610, optionally including a main frame 1612 and a test head 1614 and a handler 1630.

Automated test equipment 1610 and handler 1630 are optionally connected with a first connection 1660, for example an ethernet connection and a second connection 1670, for example a GPIB connection. FIG. 16 depicts a device under test 1650, optionally including a thermal diode, between automated test equipment 1610 or test head 1614 respectively and handler 1630. In addition, handler 1630 and automated test equipment 1610 or test head 1614 respectively are coupled with a trigger signal line 1680, e.g., a pre-trigger signal line. Respective interfaces, e.g., tester interface and handler interface are not explicitly shown. Trigger signal line 1680 may be configured to allow for a unidirectional or a bidirectional data exchange between automated test equipment 1610 and handler 1630. Trigger signal line 1680 may be configured to provide and/or receive the trigger signal and/or the signal from the handler to the automated test equipment and/or the synchronization signal and or any of the test site specific signals and/or the additional signal, for example, in real-time.

Complex digital devices (which may serve as devices under test, DUT) such as CPUs (e.g., microprocessors), GPUs (e.g., graphics processing units) and MCUs (e.g., microcontrollers) may consume a large amount of power. Power consumption and device temperature profile may vary throughout test and can be even test site dependent. Precise temperature control may be important or even essential to test these devices with a "flat" and/or predictable temperature profile. To achieve this a test cell (e.g., tester and handler) may analyze and combine different types of source data in real-time. In contrast to traditional testing where the handler controls the temperature by only measuring the test chamber temperature, the ATC can provide the handler with additional device and/or tester information to precisely control and/or forecast potential temperature hot spots.

Figure 17:
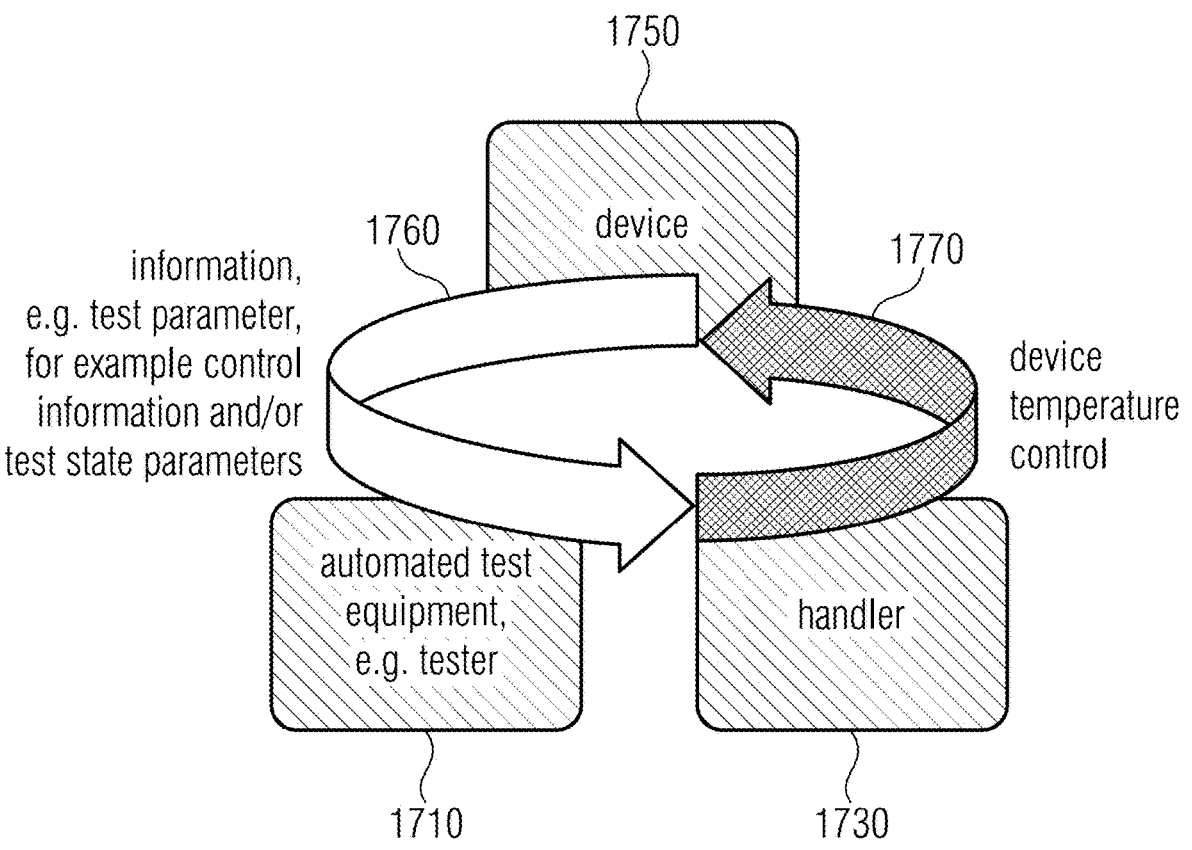
FIG. 17 is a diagram depicting an exemplary temperature control function, e.g. a device temperature control function, according to embodiments of the invention.

FIG. 17 depicts an exemplary temperature control function according to embodiments of the invention. FIG. 17 depicts a device 1750, e.g., device under test, an automated test equipment 1710 and a handler 1730. The automated test equipment 1710 may, for example receive, determine, and/or evaluate information from or based on the device under test 1750 (e.g., information 1760), which may include test parameters, control information, and/or test state parameters. The information may be further processes and provided to the handler 1730. The information provided by the automated test equipment 1710 to the handler 1730 may be any information suitable for improving testing and/or thermal regulation efficiency, e.g., device state or device status, or a predicted temperature course of the device 1750 based on a testing cycle. The handler may then control 1770 the temperature of the device 1750 based on the information provided by the automated test equipment and temperature measurements of the handler 1730 for said device 1750. Temperature calibration for the device's thermal diode may be used to cancel-out and/or reduce silicon fabrication dependencies. Site-specific alarm handling and shutdown may, in some cases, be used to alert the automated test equipment or tester, if the handler detect a temperature run-away. The trigger capability, e.g., pre-trigger capability can be extended to allow a precise, fast synchronization and/or data exchange between tester (e.g., an automated test equipment) and handler and/or vice versa.

Trigger extension, e.g., pre-trigger extension, can enable fast, low latency, real-time and/or bidirectional communication, for example, between tester and handler using pre-trigger technology. Trigger line or wire, e.g., pre-trigger line or wire can be used to modulate and/or transport data between automated test equipment. Data or information, such as "per site ALARM", "per site power shutdown", "site specific pre-trigger IDs" (e.g., for test flow branching), and/or "site dependent cooling information" can be sent in real-time between the equipment. This fast interface can reduce the amount hardware that is needed for per site pre-trigger and/or alarm handling interface, down to an existing single line, or wire, trigger, e.g., pre-trigger, interface.

When the handler cannot cool the device anymore or does not receive the temperature from the device thermal diode, in some cases it may be advantageous or even required to disconnect the device under test from the power supply. Otherwise, it may destroy the test setup. Some devices can go to 500-800 W.

In some cases, applications are required to send test site specific information in real-time to the handler. For instance, some devices have a different test setup (e.g., VDD voltage) which may lead to more heat dissipation. Therefore, the handler can be informed upon reaching a trigger point to ensure that no under-cooling/over-heating happens.

Figure 18:
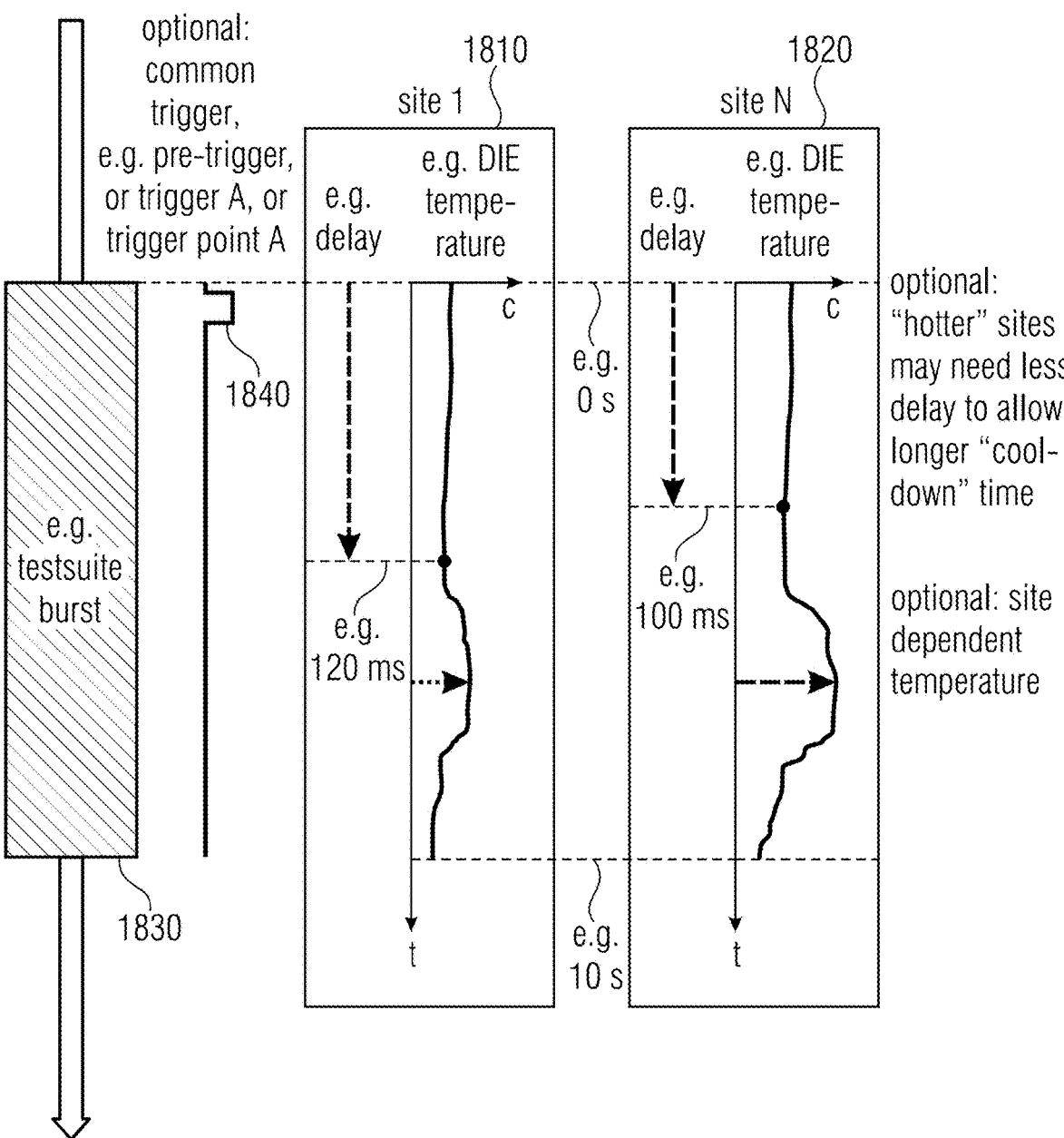
FIG. 18 depicts two exemplary test sites, a first test site (Site 1) and a second test site (Site N) according to embodiments of the present invention.

FIG. 18 depicts two exemplary test sites, a first test site 1810, Site 1 and a second test site 1820, Site N according to embodiments of the present invention. As a part of a testing routine, a test suite burst 1830 can be applied to the test sites. The test sites 1810 and 1820 may receive a trigger signal 1840, for example a common trigger or pre-trigger. For each test site 1810, 1820, an example of a temperature-over-time diagram for a DIE temperature is shown. At a starting time, the first site 1810 may have a lower DIE temperature than the second site 1820. Embodiments may be configured to take site dependent temperatures into account. As explained above, the handler, or the temperature control, e.g., in the handler, may be informed at the trigger point as shown by trigger signal 1840, close to the 0 s time, of a site characteristic, e.g., the second site 1820 being hotter. Therefore, the delay of the second, hotter site 1820 may be reduced to allow for a longer "cool down" time. As shown in FIG. 18, the first, cooler site 1810 may receive a longer delay time, e.g., 120 ms than the hotter second site 1820, receiving a shorter delay time e.g., 100 ms. In some cases, a handler may delay a cooling for a shorter period of time in case of a hotter test site to allow for a longer cool down time before the next stimulus. In this way, cooling of devices under test may be scheduled, to keep all devices under test in a desirable temperature range. In addition to the trigger signal, there may be additional site-specific information (e.g., modulated data).

Figure 19:
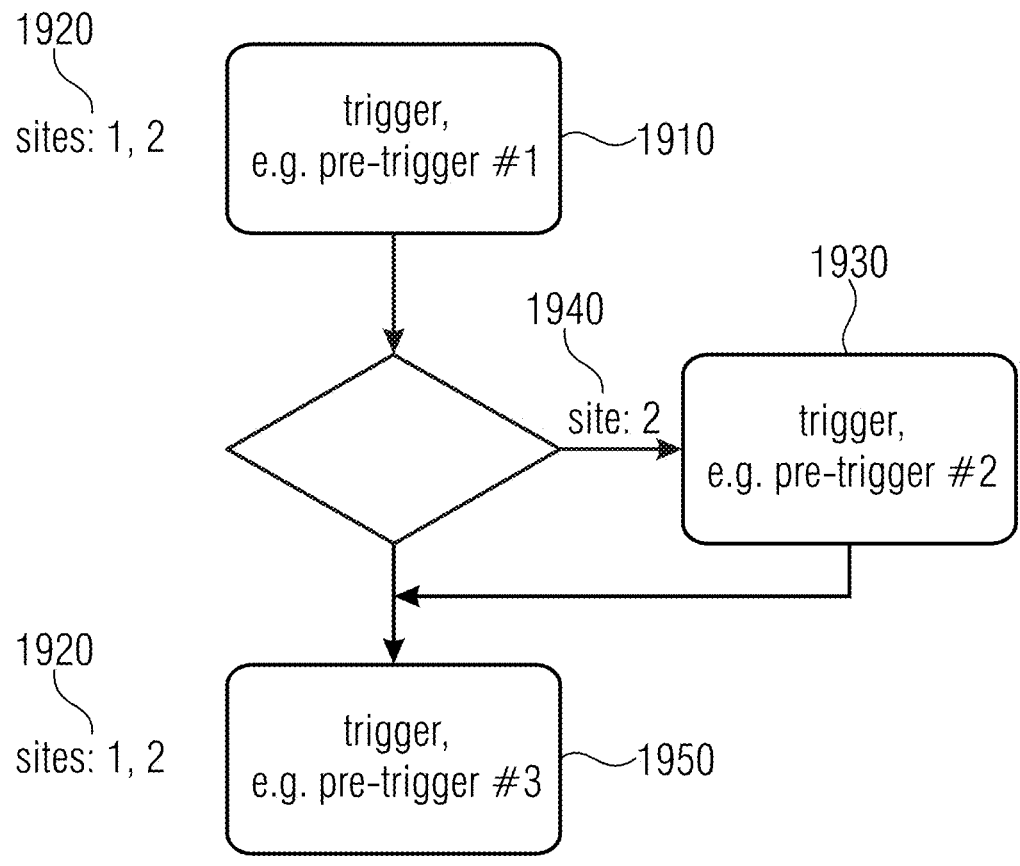
FIG. 19 depicts an exemplary test flow that can use test suites according to embodiments of the present invention.

During testing, some test sites may be executed in different branches. In some cases, this may require hardware trigger lines, e.g., pre-trigger-lines per test site. Alternatively, a single trigger line, e.g., pre-trigger line can be used, for example by identifying the trigger/pre-trigger with modulated test site ID (identification) information. Via the ID, the handler may be informed, which test site, or "short site," should act on the trigger/pre-trigger signal. Other test sites may ignore the trigger/pre-trigger. In the example of FIG. 19, test site 1 ignores pre-trigger #2.

FIG. 19 depicts an exemplary test flow (e.g., using test suites) according to embodiments of the present invention. FIG. 19 depicts a first trigger signal 1910 (pre-trigger #1). The first trigger signal 1910 may influence, or may be taken into account by the first and second test site 1920, e.g., test sites 1 and 2. As an example, a second trigger signal 1930 (pre-trigger #2) may influence, or may be taken into account only by the second test site 1940. A third trigger signal 1950

(pre-trigger #3) may influence, or may be taken into account by the first and second test site 1920.

In some cases, to protect the test setup, the handler may be configured to detect a so called "temperature run-away". This may occur when the temperature reading in the ATC loop is broken, for example, due to a defective thermal diode or cable. In this case, the handler may shut down a specific test site immediately, and may influence the data handling, or the binning and/or datalogging of the device, for example, while executing a test program. Instead of using a hardware interface that has an ALARM wire per test site, a fast, low latency interface can perform this task by modulating the site information onto the existing trigger signal or pre-trigger signal. This information can be decoded on the automated test equipment side or tester side and may shut down a site-specific power supply.

Figure 20:
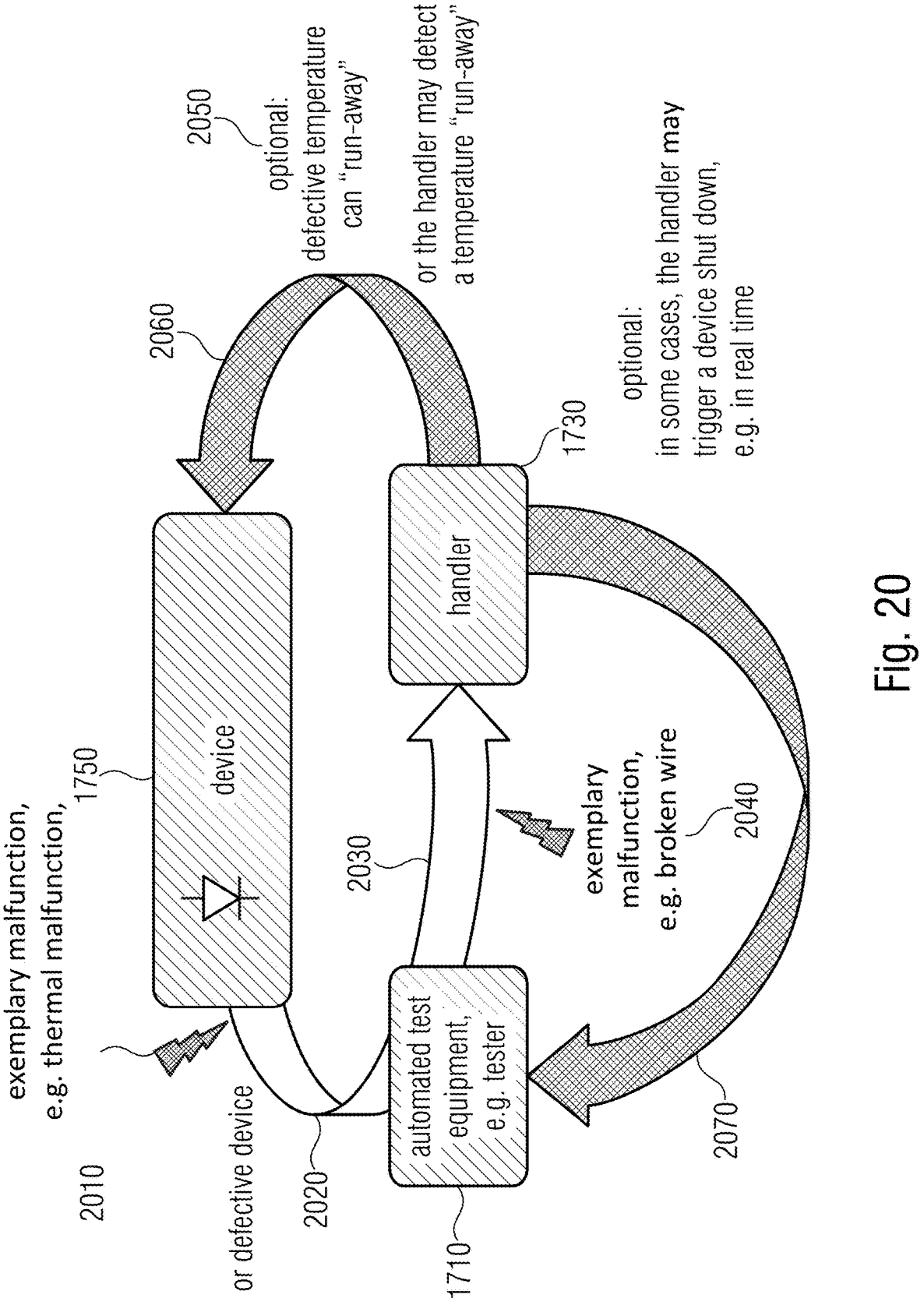
FIG. 20 depicts an exemplary alarm handling process according to embodiments of the present invention.

FIG. 20 depicts an exemplary alarm handling process according to embodiments of the present invention. FIG. 20 depicts a device 1750, an automated test equipment 1710, e.g., tester, and a handler 1730. FIG. 20 depicts different malfunctions that may occur alone or in combination, and that may be addressed by embodiments of the invention. For example, the device 1750 may suffer a malfunction 2010, e.g., a thermal malfunction, or device 1750 may suffer from a defect. In this case, the automated test equipment 1710, may detect the malfunction, or may determine that data has not been received from the device, and determine that a malfunction has likely occurred, as shown by arrow 2020. As another example, a signal 2030 between automated test equipment 110 and handler may be disturbed and suffer a malfunction 2040. As an example, a wire may be broken. As another example, the device temperature can "run-away" 2050, or the handler may detect 2060 a temperature "run-away". As explained above, in the case of malfunctions 2010 or 2050, the automated test equipment and/or the handler may detect such a malfunction based on temperature measurements. The handler may cool such a device, or the automated test equipment may shut down a corresponding test site. For example, to coordinate adequate countermeasures, the handler may be configured to trigger an alarm. The handler 1730 may trigger a device shutdown in real-time as shown by arrow 2070.

The trigger, e.g., pre-trigger, can support precise equipment synchronization. As an example, thermal diode temperature characteristics (e.g., diode reverse current) can be highly process dependent. This can be eliminated in test by a delta temperature measurement, which may require fast and precise synchronization timing between the handler and the automated test equipment or tester to measure the temperature at the correct point, for example, at a certain point in time and/or at a certain location on the device under test. Measurement can be taken under different device or test conditions such as unpowered and powered, for example, to compensate for leakage current, device turn on leakage current, or heating effects that may affect temperature measurement during this calibration step.

Figure 21:
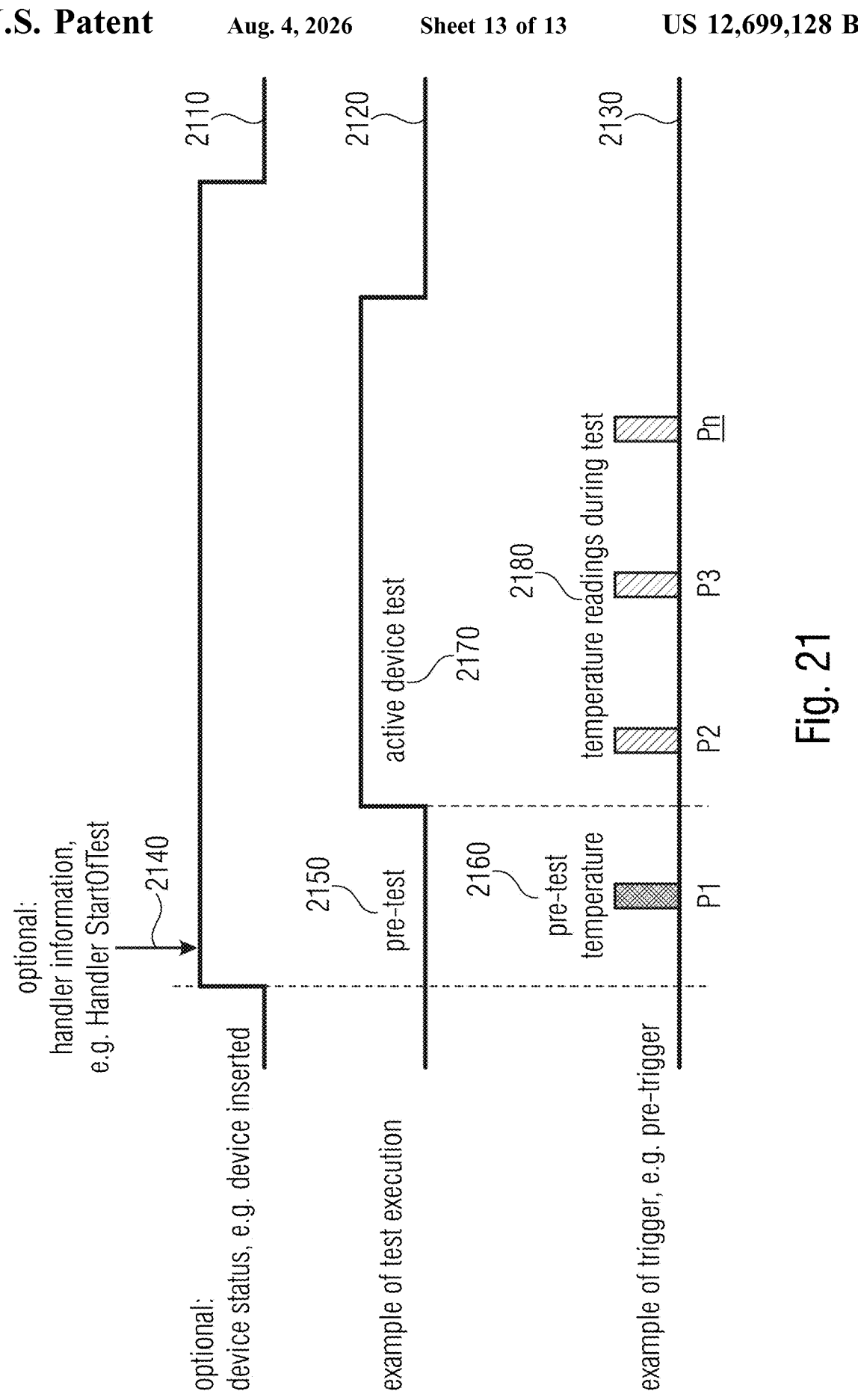
FIG. 21 depicts an exemplary calibration function according to embodiments of the present invention.

An advanced trigger signal, such as a pre-trigger, can be used to inform the handler precisely when to measure, for example, to calibrate baselines (e.g., P1 shown in FIG. 21). The baseline may be used for following temperature measurement as reference, for example, to compensate for errors. Alternatively, active synchronization may help to achieve significant test time reduction. In some cases, this can reduce or eliminate the use of WAIT insertions and/or can reduce or eliminate measurements taken under incorrect test conditions to prevent incorrect or inaccurate test results. By not having wait times, test time may be significantly reduced.

FIG. 21 depicts an exemplary calibration function according to embodiments of the present invention. including optional device status 2110, test execution 2120 and trigger signal 2130, which may be a trigger or pre-trigger. For example, the device may be inserted and optionally, the handler may provide a handler information 2140 (Handler StartOfTest), the device status 2110 that indicates that the device is in its place, and a predetermined test site/test may be started. In a Pre-Test phase 2150 of the test execution, a pre-test temperature 2160 may be triggered by the trigger signal 2130. For example, trigger P1 may be measured, as a reference. According to some embodiments, the fast, real-time, interfaces inform the handler in real-time which avoids the need for WAIT statements, and the device under test is made ready for the calibration measurement via trigger P1. Following calibration, a testing may be performed, such as an active device test 2170 of the test execution 2120. Rising temperature during testing are signaled using additional trigger signals or trigger pulses (P2, P3, Pn) provided via the trigger signal 2130.

According to some embodiments, a first trigger signal or trigger pulse P1 may signal that the device under test is ready for a reference measurement. In other words, a first trigger signal or a first trigger pulse P1 after testing has started may indicate that the device under test is ready for a reference temperature measurement, and may be interpreted by the handler to trigger such a reference temperature measurement (which may be based on an evaluation of a signal provided by a temperature measurement diode on the device under test). In other words, the first trigger signal or first trigger pulse after testing has started may indicate that a device under test is inserted in a test position and (optionally) biased appropriately to allow for the reference temperature measurement by the handler (e.g., using the temperature measurement structure on the device under test).

Additional trigger signals or trigger pulses (e.g., after the first trigger signal or trigger pulse within a test or test sequence) may be pre-trigger information signaling an expected upcoming temperature rise. Accordingly, the further trigger signals or trigger pulses may be interpreted by the handler as a pre-trigger signal, e.g., to activate a cooling in advance of a temperature rise.

Optionally, a second trigger pulse (P2) may indicate that the device is active (e.g., fully powered). However, the second trigger pulse (following the first trigger pulse) may already be a pre-trigger signal.

For example, the handler may take the reference temperature measurement in response to the first trigger pulse, and may then continuously (or repeatedly) make further temperature measurements. For example, the handler may use the reference temperature measurement for calibration purposes, e.g., to remove certain characteristics of a temperature measurement structure on the device under test from the further temperature measurements.

Other test parameters, besides the thermal diode information, may contribute to a better forecast and regulation behavior of device hot spots for early or predictive determination of cooling amplitude, duration, strength, for example, of each test site. A fast trigger, e.g., pre-trigger, and communication channel between handler and automated test equipment can be used to transport the data, e.g., parameter data or controlling parameters.

TABLE 1

| Parameter Data Examples (non-limiting) | |
| --- | --- |
| Parameter | Description |
| PMON | Monitoring real-time DUT power consumption |
| Tj | Actual DUT junction temperature |
| SPT | Synchronous trigger, e.g. pre-trigger, signal that alerts an upcoming power hot spot |
| SITE | Site specific control data |
| DUT | DUT specific control data |
| TEST | Test specific response data |
| FLOW | Test sub flow specific control data |

Exemplary Controlling Parameters that may be used:
h. Information of an upcoming temperature hot spot;
i. duration of the hot spot;
j. amplitude of the hot spot; and
k. site and device specific temperature control data.

Any of the interfaces, e.g., tester interface and or handler interface may be bidirectional, and/or dedicated, real-time interfaces. A direction of information transmission, e.g., only in one direction or both directions, may be chosen according to a specific application. In addition, any of the signals and information provided may be a test site specific information, from automated test equipment to handler or vice versa. Signals may be provided or received in any configuration of tester and handler interface. In addition, signals may include a plurality of information, e.g., a trigger information, a synchronization information and/or additional information. However, this information may as well be provided or received as distinct signals, e.g., one signal for a specific information. In addition, any of the signal or a combination thereof may be transmitted via a single channel.

Embodiments of the present invention are thus described. While the present invention has been described in particular embodiments, it should be appreciated that the present invention should not be construed as limited by such embodiments, but rather construed according to the following claims.

What is claimed is:

1. An automated test equipment (ATE) system for testing a device under test (DUT), the ATE system comprising:
   a handler coupled to a plurality of test sites by a real-time handler interface, wherein the plurality of test sites are operable to test DUTs; and
   the real-time handler interface,
   wherein the real-time handler interface is operable to:
   provide a trigger signal to the handler coupled to the real-time handler interface, wherein the trigger signal is operable to trigger and control a temperature control function of the handler, and wherein the trigger signal comprises delay information for different test sites pertaining to delays between a beginning of thermal preconditioning operations performed for the different test sites responsive to the trigger signal.

2. The automated test equipment system as described in claim 1, wherein the trigger signal further comprises at least one of: a test site specific alarm; a test site specific trigger identification; a test site specific temperature adjustment; test site specific setup information; test site specific heat dissipation information; and test site specific timing information.

3. The automated test equipment system as described in claim 1, wherein the trigger signal further comprises test site identification information.

4. The automated test equipment system as described in claim 3, wherein the test site identification information comprises a test site ID modulated onto the trigger signal.

5. The automated test equipment system as described in claim 1, wherein the trigger signal further comprises at least one of: control amplitude information; and control duration information.

6. The automated test equipment system as described in claim 1, wherein the real-time handler interface is further operable to provide a test site specific signal in response to a particular DUT reaching a predetermined state of a test flow.

7. A handler for testing a device under test (DUT), the handler comprising:

a circuit; and a real-time interface coupled to a plurality of test sites, wherein the plurality of test sites are operable to test DUTs, and wherein the circuit is operable to:

receive a trigger signal from an automated test equipment (ATE) coupled to the real-time interface, wherein the trigger signal is operable to trigger and control a temperature control function during DUT testing, wherein the trigger signal comprises delay information for different test sites pertaining to delays between a beginning of thermal preconditioning operations performed for the different test sites responsive to the trigger signal; and control a temperature control function of a particular test site of the plurality of test sites in response to the trigger signal.

8. The handler as described in claim 7, wherein the circuit is further operable to receive said trigger signal from the ATE via the real-time interface, and wherein the trigger signal comprises at least one of: a test site specific alarm; test site specific trigger identification information; test site specific temperature adjustment information; test site specific setup information; test site specific heat dissipation information; and test site specific timing information.

9. The handler as described in claim 7, wherein the trigger signal further comprises test site identification information, and wherein the test site identification information is associated with a specific test site of the plurality of test sites.

10. The handler as described in claim 9, wherein the test site identification information comprises a test site ID modulated onto the trigger signal.

11. The handler as described in claim 9, wherein the trigger signal comprises at least one of: control amplitude information; and control duration information.

12. A method of testing a device under test (DUT), the method comprising:

providing a trigger signal to a handler coupled to a plurality of DUTs via a real-time handler interface, wherein the trigger signal is operable to trigger and control a temperature control function of the handler, wherein the trigger signal comprises delay information for different test sites pertaining to delays between a beginning of thermal preconditioning operations performed for the different test sites responsive to the trigger signal; and controlling a temperature control function of the handler to test a particular DUT of the plurality of DUTs based on the trigger signal.

13. The method as described in claim 12, wherein the trigger signal comprises at least one of: a test site specific alarm; test site specific trigger identification information; test site specific temperature adjustment information; test site specific setup information; test site specific heat dissipation information; and test site specific timing information.

14. The method as described in claim 12, wherein the trigger signal further comprises test site identification information, and wherein the test site identification information is associated with a specific test site.

15. The method as described in claim 14, wherein the test site identification information comprises a test site ID modulated onto the trigger signal.

16. A method of testing a device under test (DUT) coupled to a handler, the method comprising:

receiving, at the handler, a trigger signal from an automated test equipment (ATE) via a real-time handler interface, wherein the handler is coupled to a plurality of test sites via the real-time handler interface, wherein the plurality of test sites are operable to test DUTs, wherein the wherein the trigger signal is operable to trigger and control a temperature control function of the handler, and wherein the trigger signal comprises delay information for different test sites pertaining to delays between a beginning of thermal preconditioning operations performed for the different test sites responsive to the trigger signal; and controlling a temperature control function of the handler in response to the trigger signal to test a particular DUT coupled to the handler.

17. The method as described in claim 16, wherein the trigger signal comprises at least one of: a test site specific alarm; test site specific trigger identification information; test site specific temperature adjustment information; test site specific setup information; test site specific heat dissipation information; and test site specific timing information.

18. The method as described in claim 16, wherein the trigger signal further comprises test site identification information, and wherein the test site identification information is associated with a specific test site.

* * * * *